(12) United States Patent
Yu et al.

(10) Patent No.: US 11,107,925 B2
(45) Date of Patent: Aug. 31, 2021

(54) METHODS OF FORMING CONTACT FEATURES IN FIELD-EFFECT TRANSISTORS

(71) Applicant: Taiwan Semiconductor Manufacturing Co., Ltd., Hsin-Chu (TW)

(72) Inventors: Li-Zhen Yu, Hsinchu (TW); Jia-Chuan You, Taoyuan County (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/514,736

(22) Filed: Jul. 17, 2019

(65) Prior Publication Data
US 2020/0105937 A1 Apr. 2, 2020

Related U.S. Application Data

(60) Provisional application No. 62/737,959, filed on Sep. 28, 2018.

(51) Int. Cl.
*H01L 21/02* (2006.01)
*H01L 29/78* (2006.01)
(Continued)

(52) U.S. Cl.
CPC .... *H01L 29/7851* (2013.01); *H01L 21/02381* (2013.01); *H01L 21/02532* (2013.01);
(Continued)

(58) Field of Classification Search
CPC .......... H01L 29/7851; H01L 21/02381; H01L 21/02532; H01L 27/0886; H01L 29/66795; H01L 29/7848; H01L 29/41783; H01L 21/823418; H01L 21/823814; H01L 29/41725–41791
See application file for complete search history.

(56) References Cited

U.S. PATENT DOCUMENTS 8,772,109 B2 7/2014 Colinge
8,785,285 B2 7/2014 Tsai et al.
(Continued)

*Primary Examiner* — Shahed Ahmed
(74) *Attorney, Agent, or Firm* — Haynes and Boone, LLP

(57) ABSTRACT

A method includes providing a semiconductor structure having metal gate structures (MGs), gate spacers disposed on sidewalls of the MGs, and source/drain (S/D) features disposed adjacent to the gate spacers; forming a first dielectric layer over the MGs and forming S/D contacts (MDs) over the S/D features; forming a second dielectric layer over the first dielectric layer, where portions of the second dielectric layer contact the MDs and the second dielectric layer is different from the first dielectric layer in composition; removing the portions of the second dielectric layer that contact the MDs; forming a conductive layer over the MDs and over the first dielectric layer; and removing portions of the conductive layer to form conductive features over the MDs.

20 Claims, 34 Drawing Sheets

(51) Int. Cl.
  *H01L 27/088* (2006.01)
  *H01L 29/66* (2006.01)
(52) U.S. Cl.
  CPC .... *H01L 27/0886* (2013.01); *H01L 29/66795* (2013.01); *H01L 29/7848* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2017/0103948 A1* | 4/2017 | Lee .................. H01L 21/76864 |
| 2018/0337059 A1* | 11/2018 | Basker .............. H01L 29/42392 |
| 2020/0044034 A1* | 2/2020 | Economikos ........ H01L 29/401 |
| 2020/0066602 A1* | 2/2020 | Greene ............ H01L 21/76897 |

\* cited by examiner

METHODS OF FORMING CONTACT FEATURES IN FIELD-EFFECT TRANSISTORS

CROSS-REFERENCE TO RELATED APPLICATIONS

This application claims priority to U.S. Provisional Patent Application Ser. No. 62/737,959 filed on Sep. 28, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of vertical interconnects becomes more challenging as feature sizes continue to decrease. At smaller length scales, typical methods of forming vertical interconnects over source/drain contacts (MDs) and/or metal gate stacks (MGs) may benefit from increased processing window, reduced processing complexity, and lowered production costs in an effort to improve device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
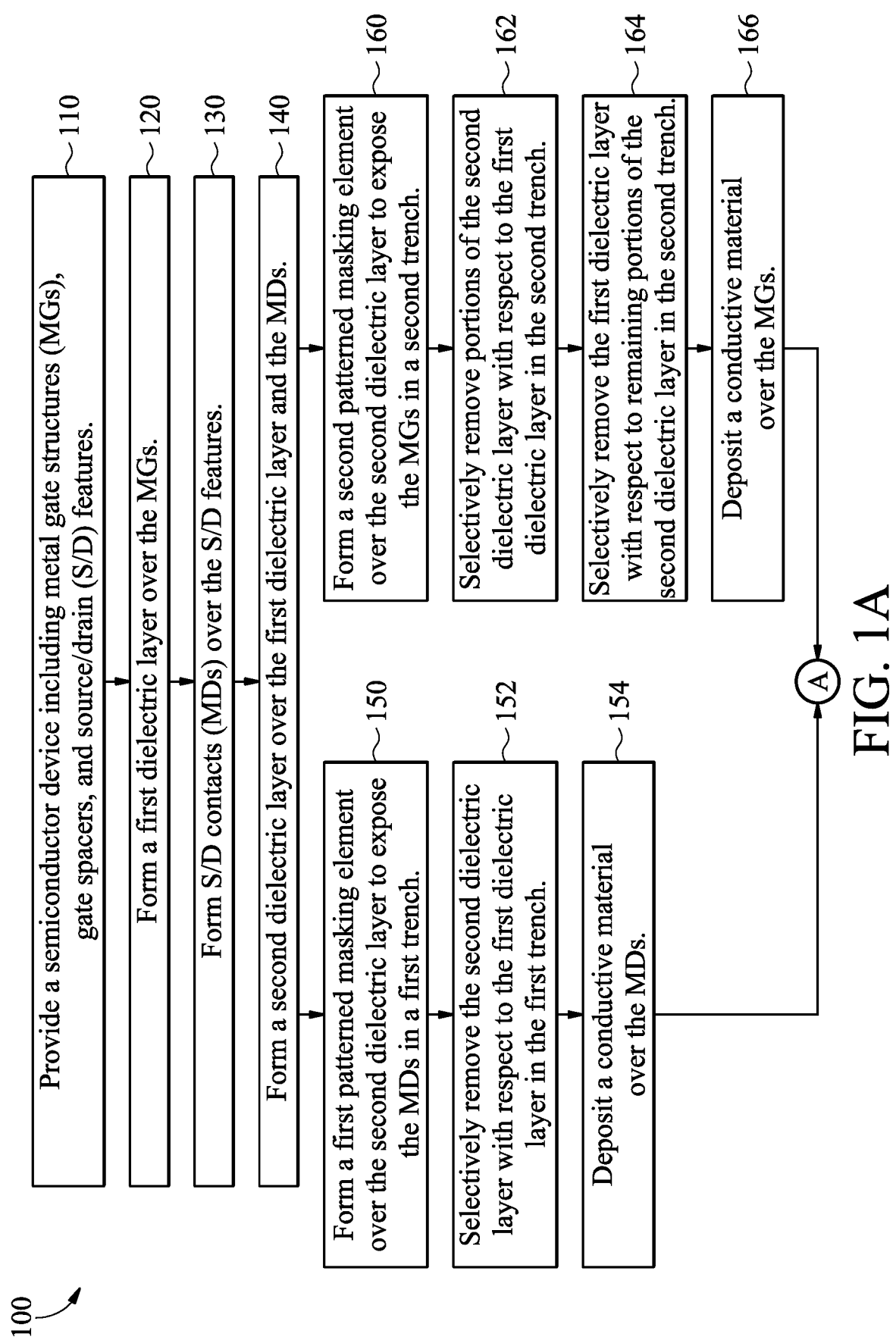
FIGS. 1A and 1B show a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-like FETs (FinFETs), or gate-all-around (GAA) FETs. It is an objective of the present disclosure to provide vertical interconnect features (e.g., via contact features) for connecting device-level contact features (e.g., source/drain contacts, metal gate stacks, etc.) with additional interconnect features in semiconductor devices.

In FET fabrication, lithography patterning processes is typically implemented to form a contact trench (or a contact hole) over each device-level features (e.g., source/drain or S/D contact, metal gate stacks, etc.), before depositing a conductive material in the contact trench to form a vertical interconnect feature (hereafter referred to as a via contact feature). Generally, to minimize contact resistance, sufficient contact area between the via contact features and the device-level contact features should be ensured. However, as device sizes continue to decrease, processing complexity and cost associated with providing sufficient contact area increases. For example, potential overlay errors associated with the lithography process may reduce the contact area between the via contact feature and the device-level contact feature, thereby compromising the device performance. Additionally, as a pitch between neighboring via contact features becomes comparable to the resolution of the lithographic source used for the patterning process, it may be necessary to implement multiple masks to remedy potential overlay errors, thereby increasing production complexity and cost. For these and other reasons, it is desirable to improve methods for forming via contact features, particularly for ensuring sufficient contact area between the via contact features and the device-level contact features during FET fabrication processes.

Figure 1B:
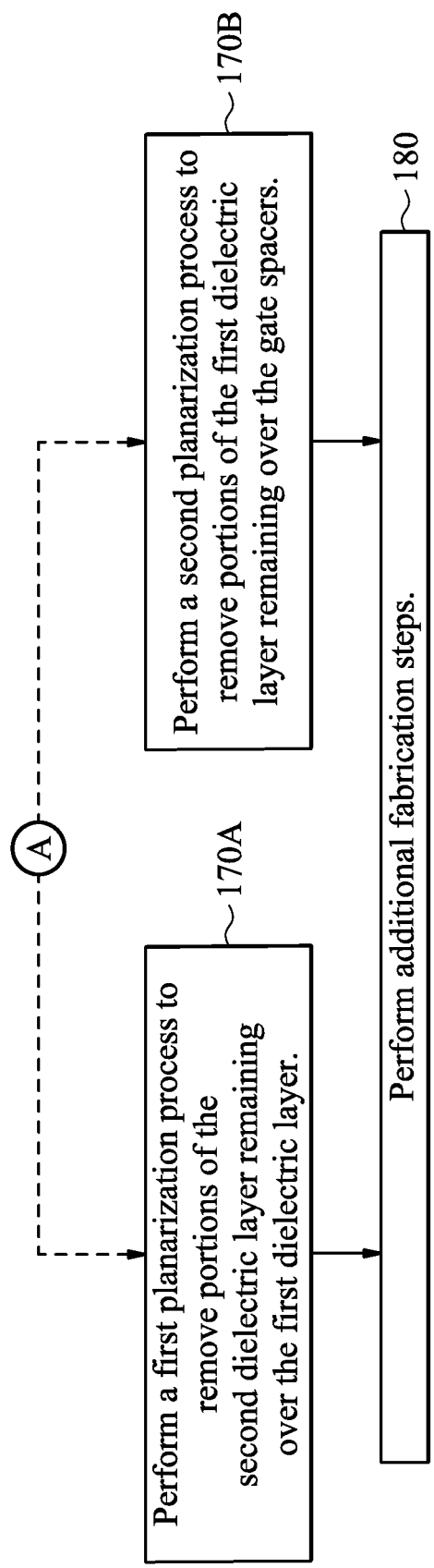
Figure 2A:
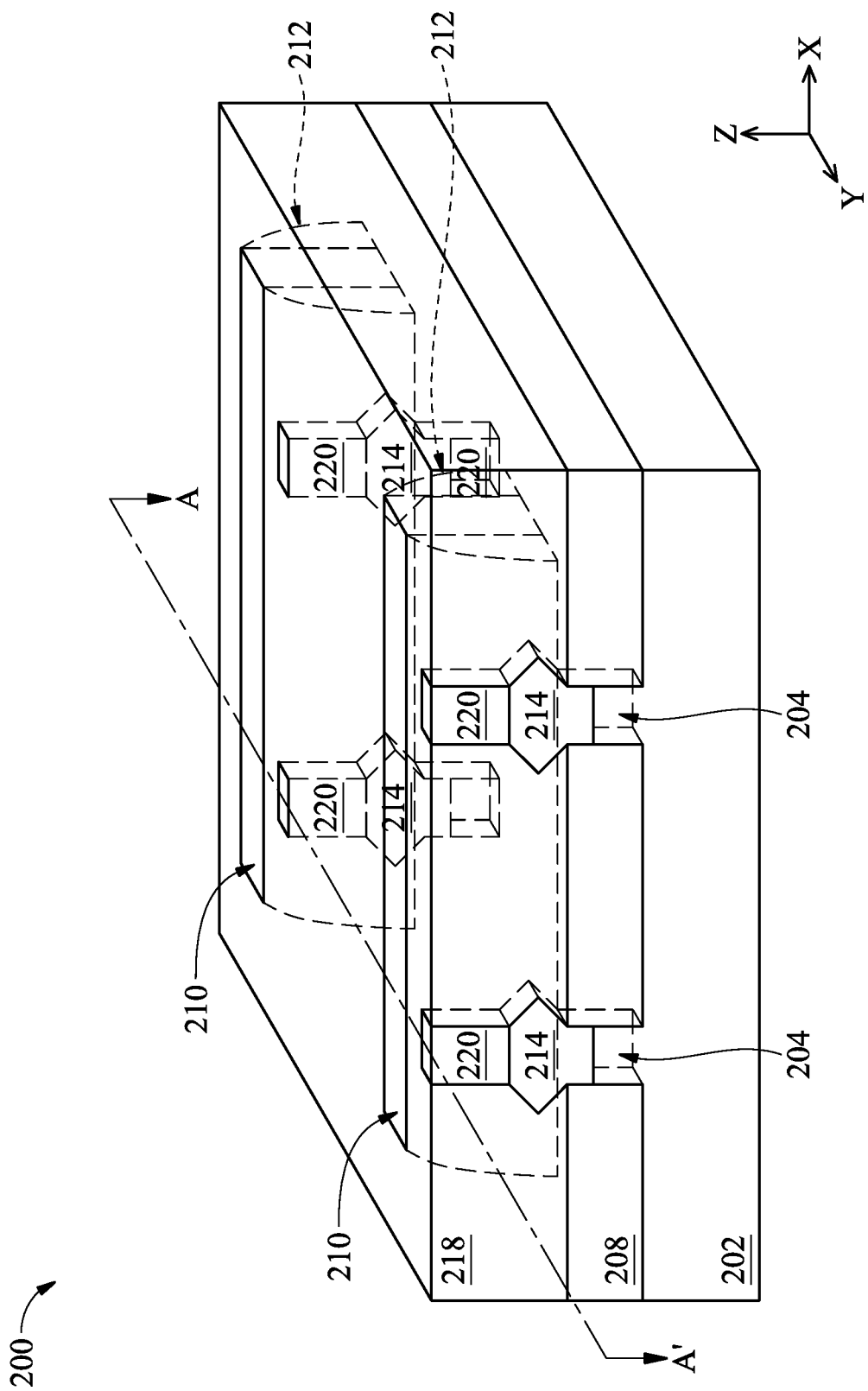
FIG. 2A is a perspective three-dimensional view of an embodiment of a semiconductor device according to various aspects of the present disclosure.

FIGS. 1A and 1B illustrate an embodiment of a method 100 for forming a semiconductor device 200 according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-17C, which illustrate a portion of the semiconductor device 200 during intermediate steps of the method 100. FIGS. 3-17C are cross-sectional views of the device 200 taken along dashed line AA' as illustrated in FIGS. 2A and/or 2B. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, GAA FETs, metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 2B:
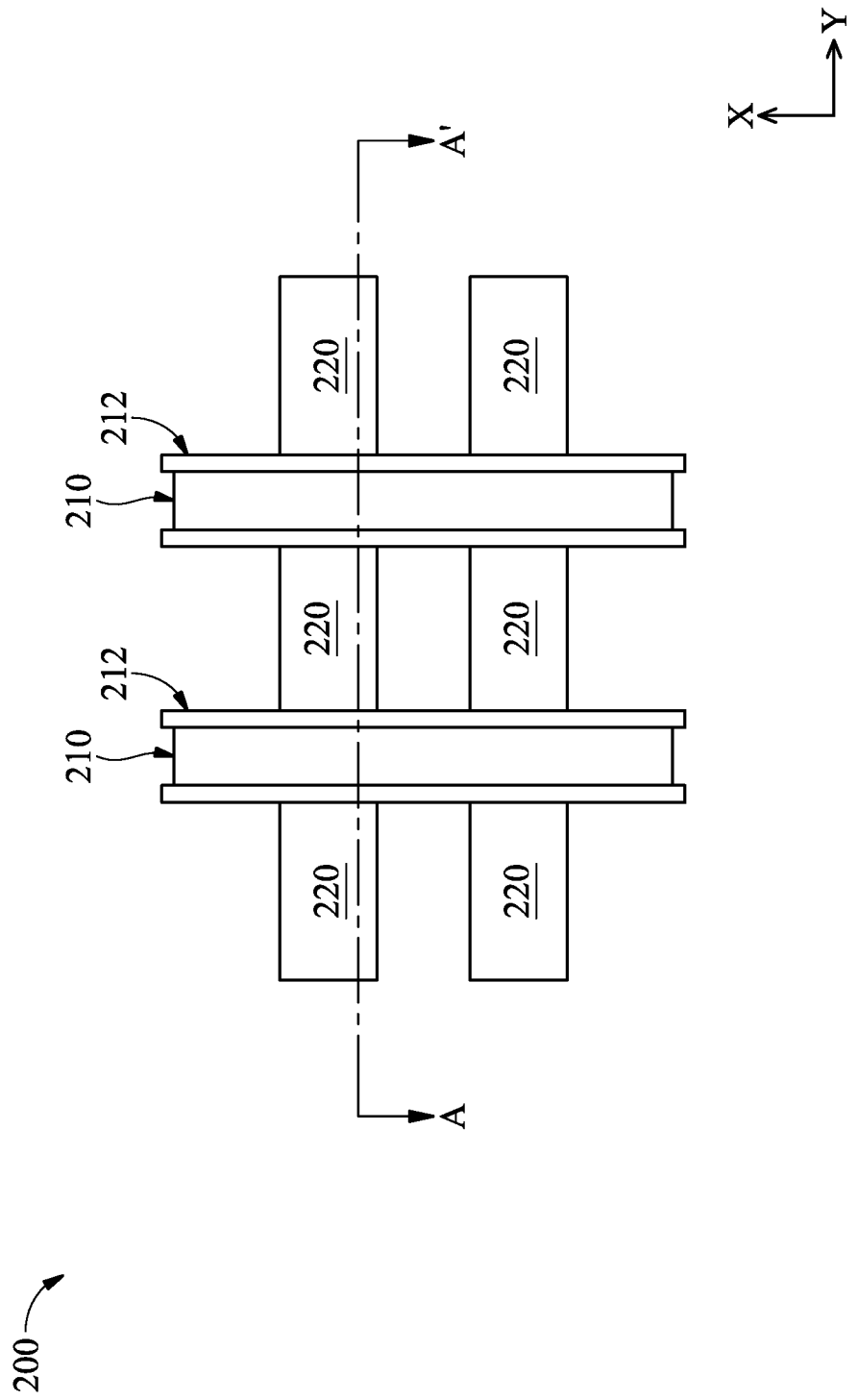
FIG. 2B is a planar top view of an embodiment of a semiconductor device according to various aspects of the present disclosure.
Figure 3:
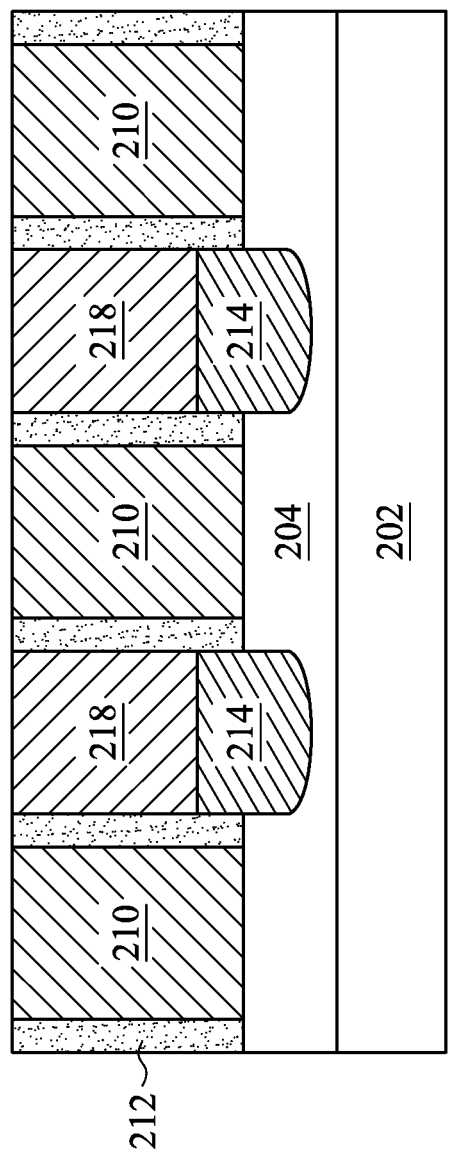
FIGS. 3, 4, 5, 6, 7, 8, 9, 10, 11, 12, 13, 14A, 14B, 14C, 14D, 14E, 15A, 15B, 15C, 15D, 15E, 15F, 16A, 16B, 16C, 16D, 16E, 17A, 17B, and 17C are cross-sectional views of an embodiment of the semiconductor device of FIG. 2A and/or FIG. 2B along line AA' during intermediate steps of an embodiment of the method of FIGS. 1A and 1B according to various aspects of the present disclosure.

At operation 110, referring to FIGS. 2A, 2B, and 3, the method 100 provides a device 200 including a substrate 202 having a three-dimensional active region 204 (hereafter referred to as fin 204) disposed thereover. The device 200 further includes a high-k metal gate (HKMG) structure 210 disposed over the fin 204, gate spacers 212 disposed on sidewalls of the HKMG structure 210, source/drain (S/D) features 214 disposed over the fin 204, isolation structures 208 disposed over the substrate 202 separating various components of the device 200, and an interlayer dielectric (ILD) layer 218 disposed over the isolation structures 208 and the S/D features 214. As depicted in FIGS. 2A and 2B, two fins 204 are present in the device 200. For purposes of clarity, however, methods of the present disclosure will be discussed with reference to one of the two fins 204; of course, the present disclosure is equally applicable to the other one of the two fins 204.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 2A, 2B, and 3, the fins 204 may be suitable for forming a p-type or an n-type FinFET. The fin 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization/polishing (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A, 2B, and 3, the device 200 includes S/D features 214 disposed over the fins 204, each being disposed adjacent to the HKMG structure 210. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the S/D features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

The device 200 further includes the HKMG structure 210 disposed over a portion of the fins 204, such that it interposes S/D features 214. The HKMG structure 210 includes a high-k dielectric layer (i.e., having a dielectric constant greater than that of silicon oxide; not depicted) disposed over the fins 204 and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Example work function materials include TiN, TaN, $ZrSi_2$, $MoSi_2$, $TaSi_2$, $NiSi_2$, Ti, Ag, TaAl, TaAlC, TiAlN, TaC, TaCN, TaSiN, Ru, Mo, Al, WN, Mn, Zr, other suitable work function materials, or combinations thereof. The bulk conductive layer may include Cu, W, Ru, Al, Co, other suitable materials, or combinations thereof. The HKMG structure 210 may further include numerous other layers (not depicted), such as an interfacial layer disposed between the fins 204 and the high-k dielectric layer, hard mask layers, capping layers, barrier layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof. A polishing process, such as CMP, may be performed to remove excess materials from a top surface of the HKMG structure 210 to planarize a top surface of the device 200.

The device 200 further includes gate spacers 212 disposed on sidewalls of the HKMG structure 210. The gate spacers 212 may include a dielectric material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. The gate spacers 212 may be a single layered structure or a multi-layered structure. Notably, the composition of the gate spacers 212 is distinct from that of the surrounding dielectric components, such that an etching selectivity may exist between the gate spacers 212 and the surrounding dielectric components during subsequent etching processes. The gate spacers 212 may be formed by first depositing a blanket of spacer material over the device 200, and then performing an anisotropic etching process to remove portions of the spacer material to form the gate spacers 212 on sidewalls of the dummy gate structure.

In some embodiments, the HKMG structure 210 is formed after other components of the device 200 (e.g., the S/D features 214) are fabricated. Such process is generally referred to as a gate replacement process, which includes forming a dummy gate structure (not depicted) as a placeholder for the HKMG structure 210, forming the S/D features 214, forming the ILD layer 218 (and optionally a contact etch-stop layer, or CESL) over the dummy gate structure and the S/D features 214, planarizing the ILD layer 218 by, for example, CMP, to expose a top surface of the dummy gate structure, removing the dummy gate structure in the ILD layer 218 to form a trench that exposes a channel region of the fins 204, and forming the HKMG structure 210 in the trench to complete the gate replacement process. In some embodiments, the ILD layer 218 includes a dielectric material, such as tetraethylorthosilicate (TEOS), a low-k dielectric material, silicon oxide, doped silicon oxide such as borophosphosilicate glass (BPSG), fluoride-doped silicate glass (FSG), phosphosilicate glass (PSG), boron doped silicon glass (BSG), other suitable dielectric materials, or combinations thereof. The ILD layer 218 may include a multi-layer structure having multiple dielectric materials and may be formed by a deposition process such as, for example, CVD, FCVD, SOG, other suitable methods, or combinations thereof. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Figure 4:
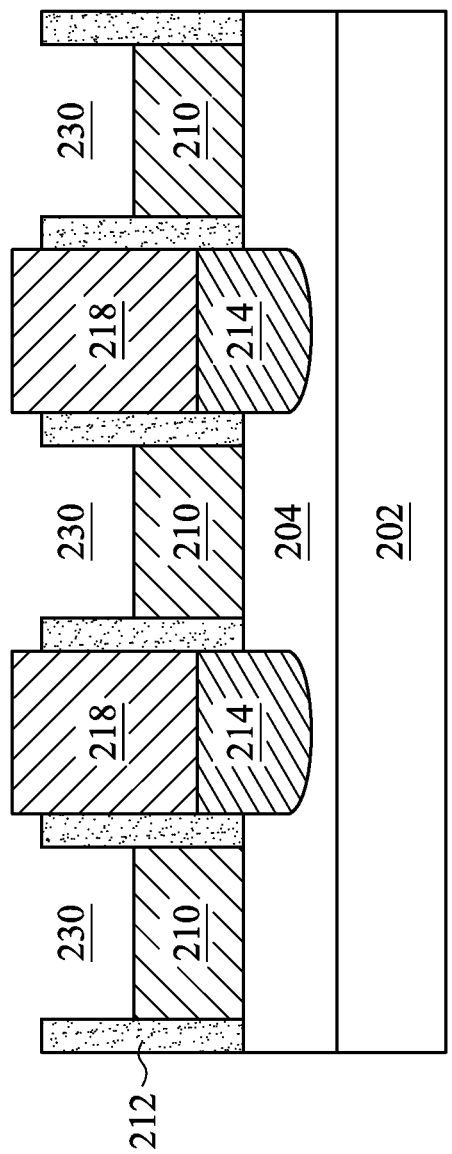
Figure 5:
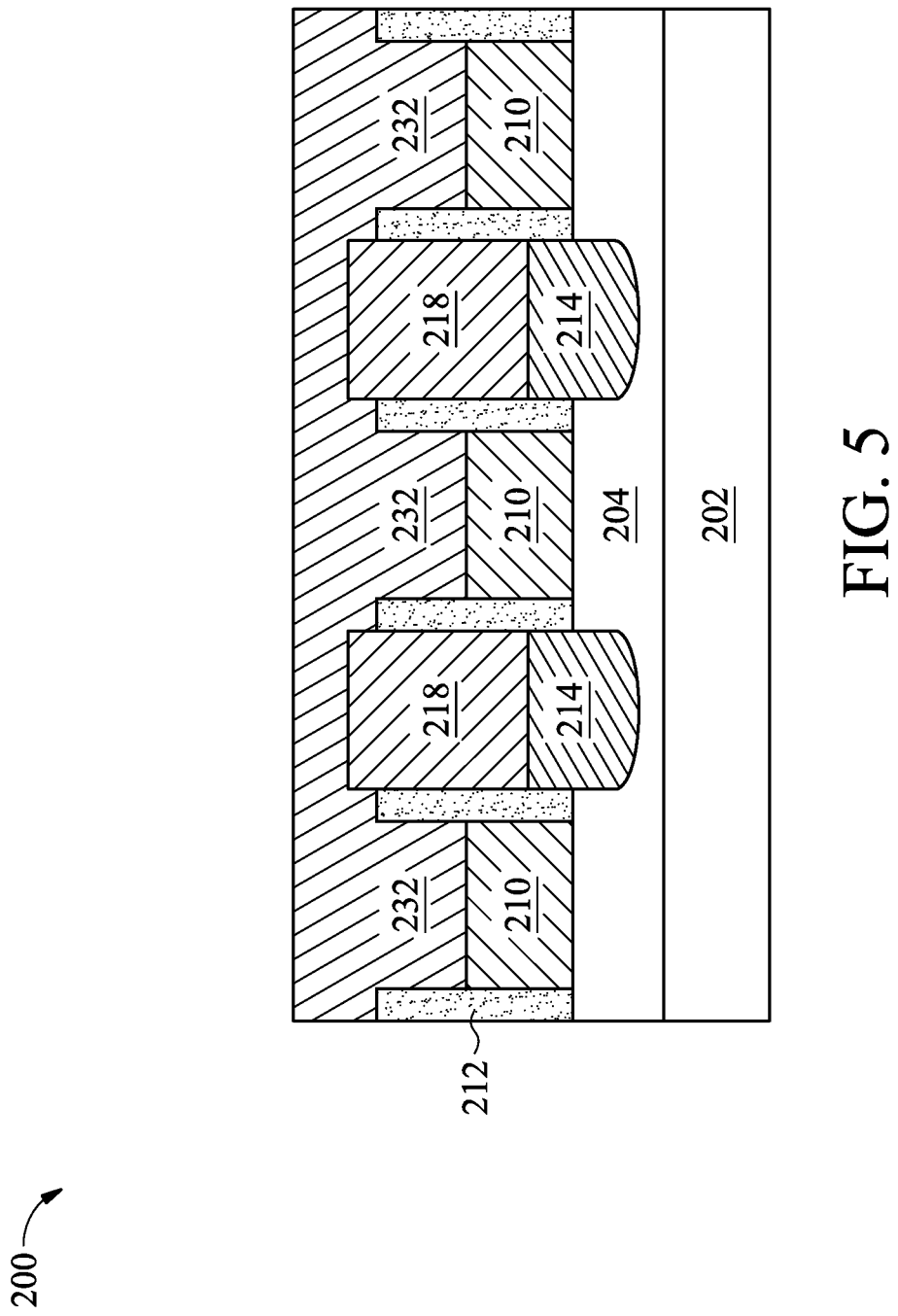
Figure 6:
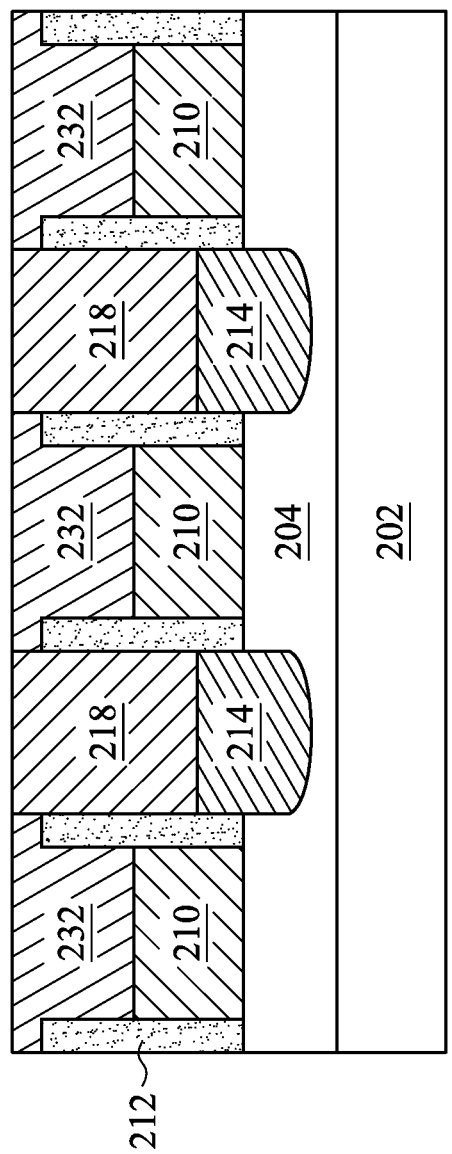

Referring to FIGS. 4-6, the method 100 at operation 120 forms a dielectric layer 232 over the HKMG structures 210. Referring to FIG. 4, the method 100 first removes portions of the HKMG structures 210 to form trenches 230. In some embodiments, the method 100 performs an etching process, such as a dry etching process, to form the trenches 230. The etching process selectively removes the HKMG structures 210 with respect to the ILD layer 218, such that the ILD layer 218 is not etched, or only minimally etched. In some examples, as depicted herein, top portions of the gate spacers 212 may be removed during operation 120.

Referring to FIGS. 5-6, the method 100 then forms the dielectric layer 232 in the trenches 230. In the present embodiments, referring to FIG. 5, the method 100 deposits a dielectric material by a suitable method, such as CVD, ALD, FCVD, PVD, other suitable methods, or combinations thereof. The dielectric layer 232 may include any suitable material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. Thereafter, referring to FIG. 6, the method 100 planarizes a top surface of the device 200 using a suitable method such as CMP to expose a top surface of the ILD layer 218. As such, each portion of the dielectric layer 232 disposed over the HKMG structure 210 is configured to have a "T" shape, a top portion of which is disposed over the gate spacers 212. In other words, the dielectric layer 232 is self-aligned with gate spacers 212. Alternatively, though not depicted, the method 100 may form the dielectric layer 232 by selectively depositing the dielectric layer 232 in the trench 230 over the HKMG structure 210 and the gate spacers 212 but not over the ILD layer 218. In some examples, the selective deposition process may utilize materials such as silicon nitride, silicon oxide, silicon carbide, silicon oxycarbide, or silicon oxycarbonitride to form the dielectric layer 232.

Figure 7:
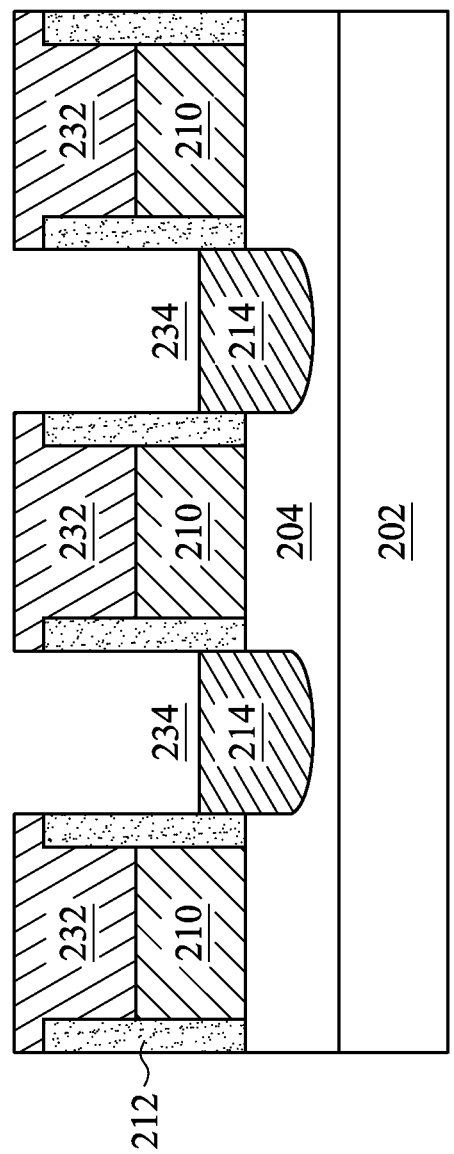
Figure 8:
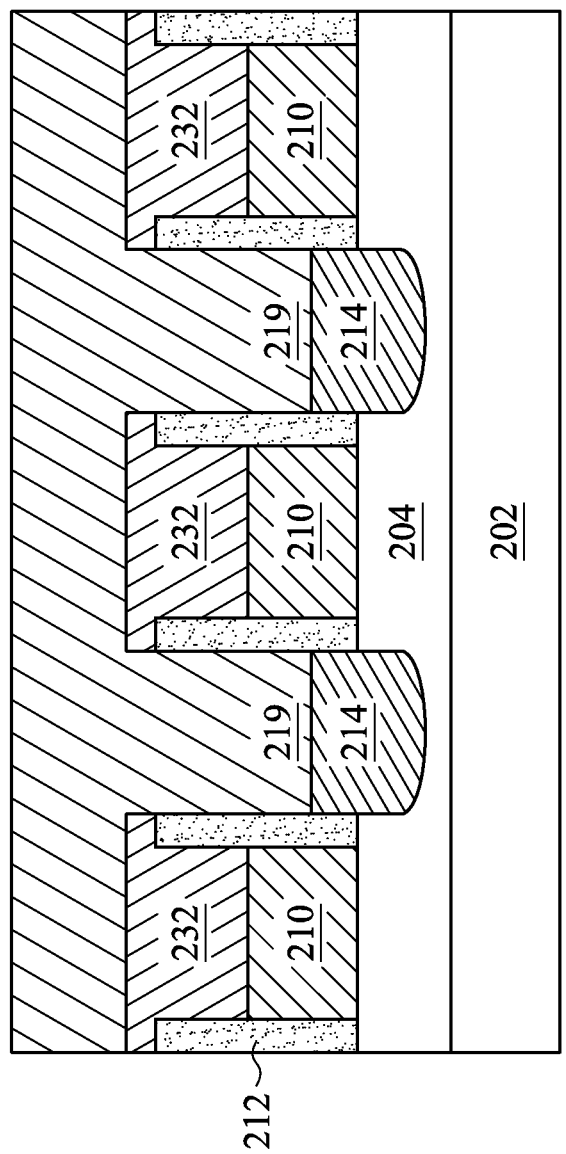
Figure 9:
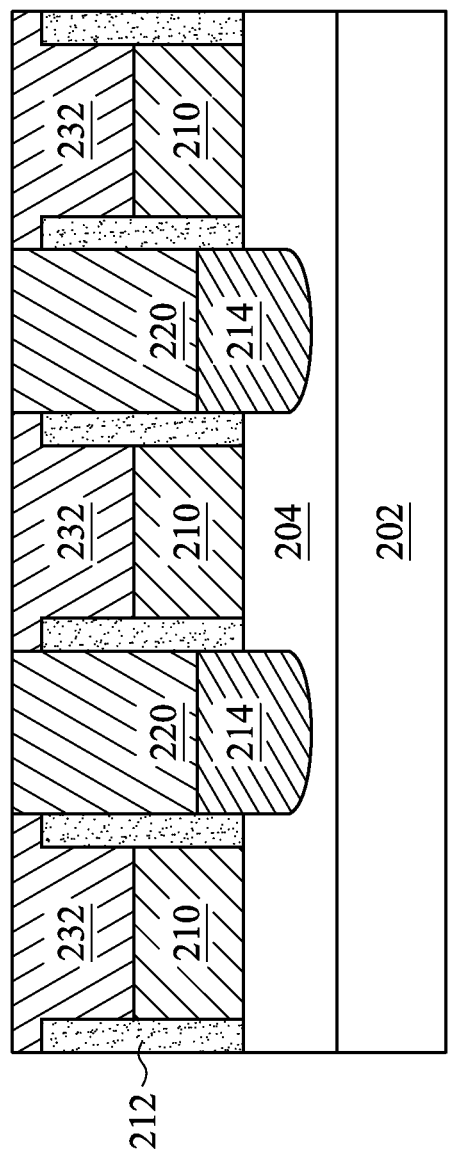

Referring to FIGS. 7-9, the method 100 at operation 130 forms S/D contacts 220 over the S/D features 214. Referring to FIG. 7, the method 100 removes portions of the ILD layer 218 disposed over the S/D features 214 to form trenches 234. The method 100 may implement any suitable etching process (e.g., dry etching, wet etching, RIE, etc.) to form the trenches 234. In some embodiments, the etching process is a dry etching process that employs one or more etchant, such as a fluorine-containing gas (e.g., $C_4F_6$, $CF_4$, $SF_6$, $CH_2F_2$, $CHF_3$, and/or $C_2F_6$), oxygen, hydrogen, other suitable gases, or combinations thereof. In the depicted embodiment, the etching process employs a mixture of $C_4F_6$, oxygen, and hydrogen as an etchant. Referring to FIG. 8, the method 100 then deposits a conductive material 219 in the trenches 234 and over portions of the dielectric layer 232. The conductive material 219 may include any suitable material, such as. W, Co, Ru, Cu, Ta, Ti, Al, Mo, other suitable conductive materials, or combinations thereof. The conductive material 219 may be deposited by any suitable method, such as CVD, PVD, ALD, plating, other suitable methods, or combinations thereof. Thereafter, referring to FIG. 9, the method 100 planarizes the top surface of the device 200 using a suitable method such as CMP to form the S/D contacts 220 over the S/D features 214. In some embodiments, portions of the conductive material formed over the dielectric layer 232 are removed by the CMP process, such that a top surface of the S/D contacts are substantially coplanar with a top surface of the dielectric layer 232.

Figure 10:
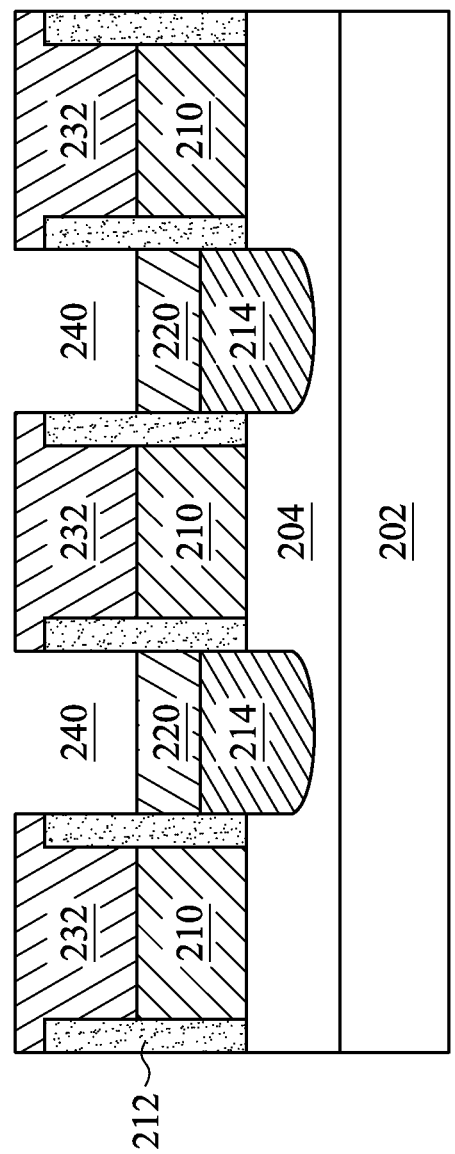
Figure 11:
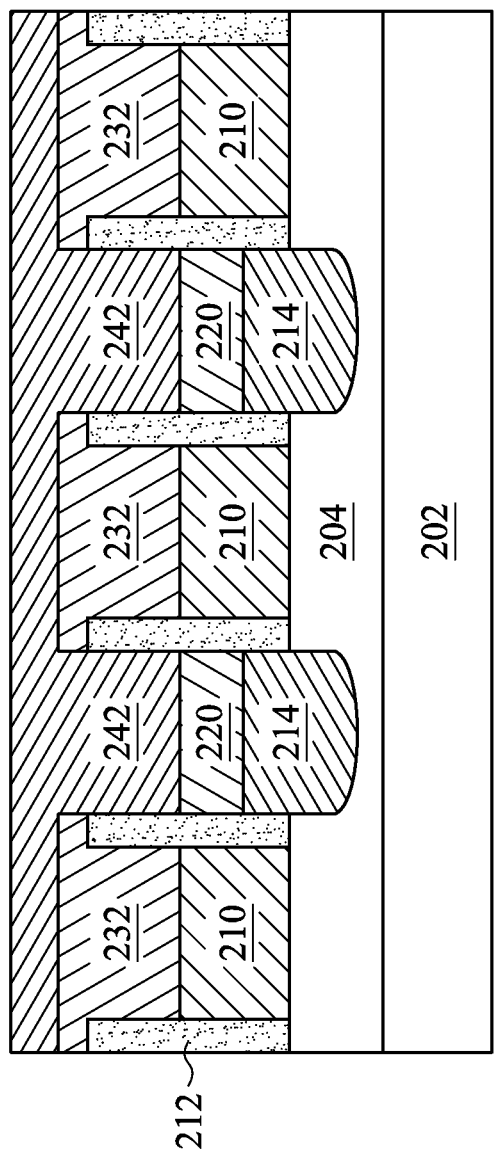
Figure 12:
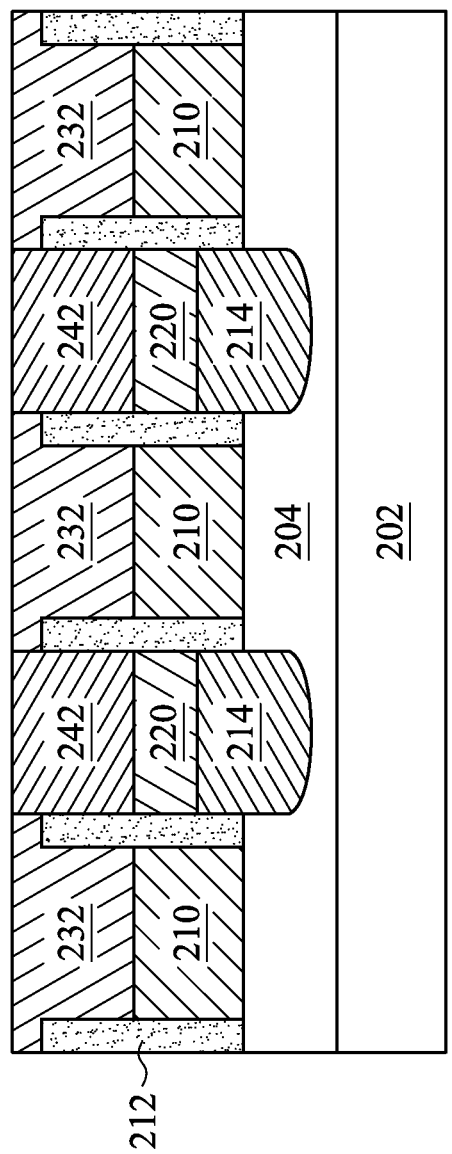

Referring to FIGS. 10-12, the method 100 at operation 140 forms a dielectric layer 242 over the dielectric layer 232 and the HKMG structures 210. In some embodiments, referring to FIG. 10, the method 100 first removes portions of the S/D contacts 220 to form trenches 240, which are disposed between gate spacers 212 and portions of the dielectric layer 232. The method 100 may implement any suitable etching process (e.g., dry etching, wet etching, RIE, etc.) to form the trenches 240. In the present disclosure, the etching process may be a wet etching process that employs a mixture of acid, such as sulfuric acid ($H_2SO_4$), as an etchant. In some embodiments, the wet etching process is controlled by controlling the duration of the etching process. Referring to FIG. 11, the method 100 then deposits a dielectric layer 242 in the trenches 240 and over portions of the dielectric layer 232 using any suitable method, such as CVD, ALD, FCVD, PVD, other suitable methods, or combinations thereof. The dielectric layer 242 may include any suitable dielectric material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. Notably, in the present disclosure, the dielectric layer 242 has a composition different from that of the dielectric layer 232, such that an etching selectivity exists between them when subjected to a common etchant as will be discussed in detail below. Thereafter, referring to FIG. 12, the method 100 planarizes the top surface of the device 200 to expose the top surface of the dielectric layer 232, such that a top surface of the dielectric layer 242 is substantially coplanar with the top surface of the dielectric layer 232.

Figure 13:
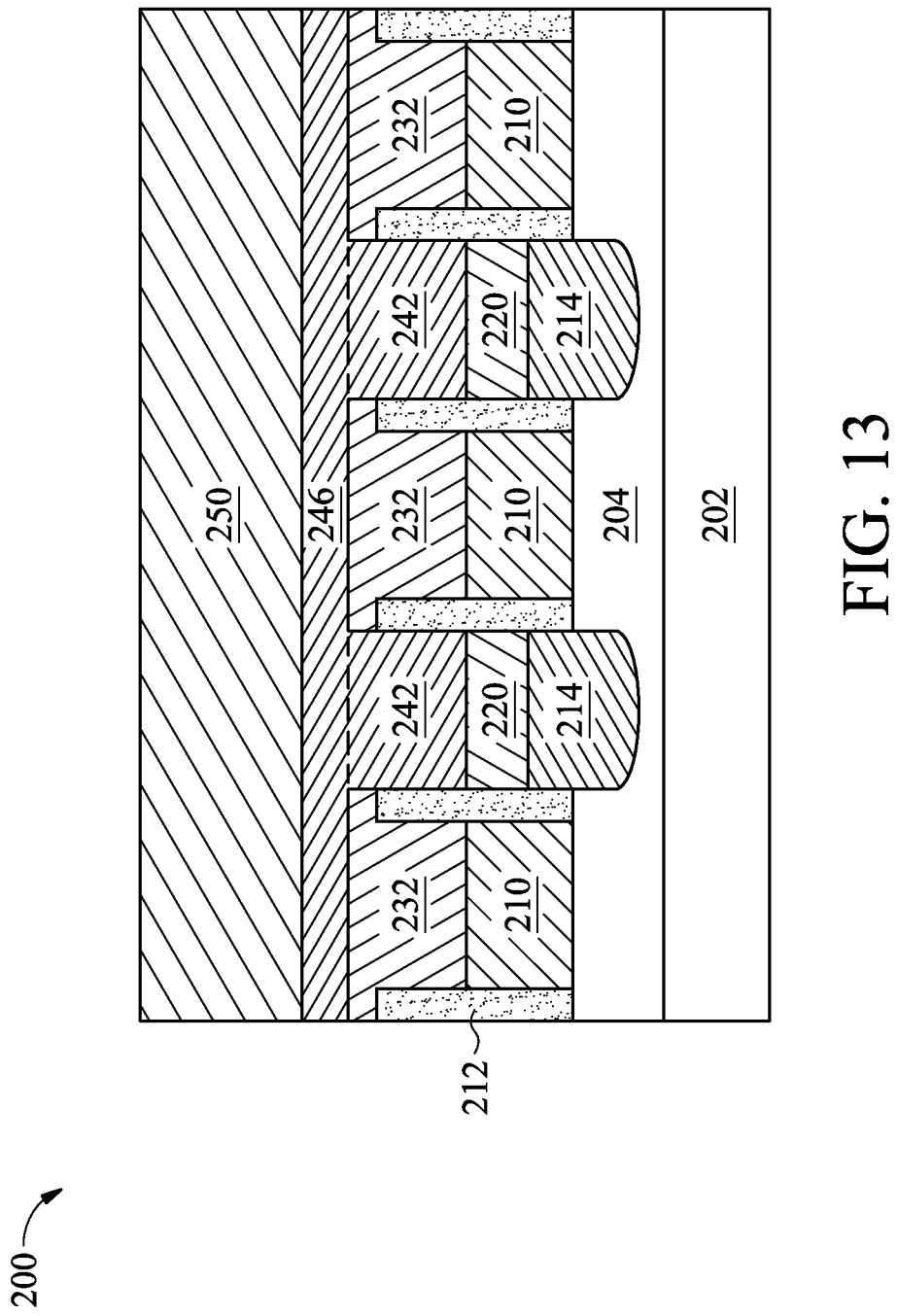

Referring to FIG. 13, the method 100 forms an etch-stop layer (ESL) 246 over the device 200 and subsequently forms an ILD layer 250 thereover. In some embodiments, the ESL 246 is omitted from the device 200. In the depicted embodiments, the ESL 246 has substantially the same composition as the dielectric layer 242. Notably, similar to the discussion above with respect to the dielectric layer 242, the ESL 246 has a different composition from the dielectric layer 232, such that they may have enhanced etching selectivity when subjected to an etching process discussed in detail below. In some embodiments, the method 100 deposits the ESL 246 using any suitable method, such as CVD, ALD, FCVD, PVD, other suitable methods, or combinations thereof. Thereafter, the method 100 forms another ILD layer 250 over the ESL 246 using any suitable method, such as CVD, FCVD, SOG, other suitable methods, or combinations thereof. Similar to the ILD layer 218, the ILD layer 250 includes a dielectric material, such as TEOS, a low-k dielectric material, silicon oxide, doped silicon oxide such as BPSG, FSG, PSG, BSG, other suitable dielectric materials, or combinations thereof. The ILD layer 250 may include a multi-layer structure having multiple dielectric materials.

The present disclosure provides methods of forming via contact features over the S/D contacts 220 and over the HKMG structures 210, respectively. For example, referring back to FIG. 1A, operations 150, 152, and 154 are directed to an example method of forming via contact features over the S/D contacts 220, and operations 160, 162, 164, and 166 are directed to an example method of forming via contact features over the HKMG structures 210. Because the device 200 may include multiple S/D contacts 220 and multiple HKMG structures 210 as discussed and depicted herein, the operations 150-154 may be implemented to a region 200A of the device 200 that includes at least two S/D contacts 220 (hereafter discussed in reference to FIGS. 14A-14E), and the operations 160-166 may be implemented to a region 200B of the device 200 that includes at least two HKMG structures 210 (hereafter discussed in reference to FIGS. 15A-15F). The present disclosure does not limit an arrangement of the region 200A relative to the region 200B, which may either be adjacent to, separated from, or overlapping with each other, depending upon the specific design requirements.

Figure 14A:
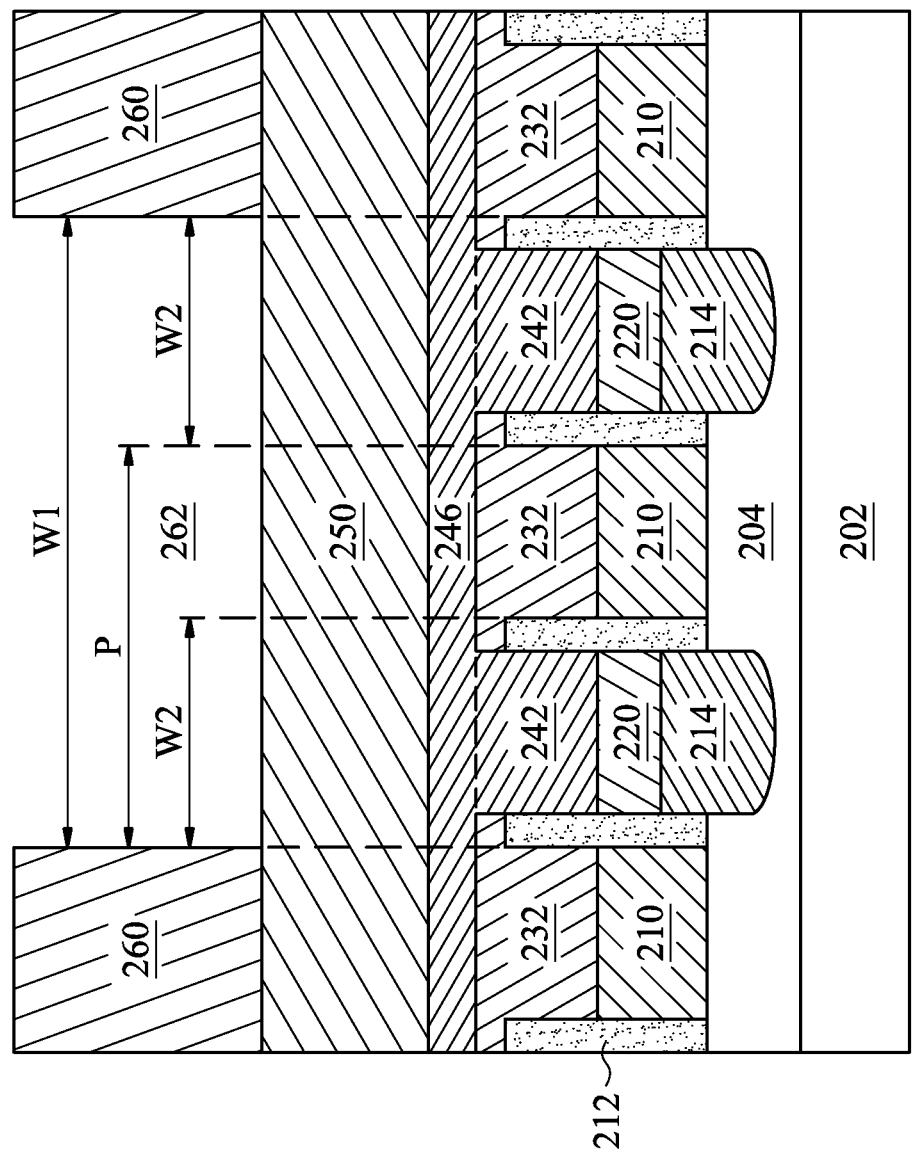

Referring to FIG. 14A, the method 100 at operation 150 forms a patterned masking element 260 over the region 200A, such that a portion of the region 200A is exposed by a trench 262 formed in the patterned masking element 260. In some embodiments, the trench 262 is configured to subsequently expose at least two S/D contacts 220 (and any material layers formed thereover) disposed between the gate spacers 212. In the depicted embodiment, for example, the trench 262 is disposed above two S/D contacts 220 and an HKMG structure 210 disposed therebetween. In some embodiments, a width W1 of the trench 262 is not limiting, so long as it is wide enough to expose portions of the ILD layer 250 and the dielectric layer 242 and/or the ESL 246 disposed vertically above at least two S/D contacts 220. The patterned masking element 260 may include a resist material (e.g., a photoresist material) patterned by one or more lithography processes.

Generally, when forming via contact features over S/D contacts (e.g., S/D contacts 220), an opening (e.g., a trench) is configured to only expose individual S/D contacts and not the components (e.g., HKMG structures 210) disposed between neighboring S/D contacts. In other words, as depicted in FIG. 14A, instead of implementing the masking element 260 with an opening defined by the width W1, multiple openings each defined by a width W2 would have been formed over the device 200. In advanced technology nodes, a pitch P, which describes a spacing between adjacent openings, may be reduced to below a resolution of the lithographic source (e.g., extreme ultra-violet, or EUV, light) used to pattern the masking element. In such an example, it may be necessary to implement multiple patterning processes to ensure that openings with proper dimensions (e.g., the width W2) are provided for forming the via contact features, leading to increased production costs and complexity. Additionally, smaller openings reduce the window for the patterning process, exacerbating the effects of potential exposure overlay errors associated with the lithography process. Embodiments of the present disclosure address these and other challenges by implementing a single patterning process (with a masking element having a single opening that exposes more than one S/D contacts) in combination with dissimilar dielectric material layers (e.g., the dielectric layers 232 and 242) to improve etching selectivity during the patterning process. Notably, absent the dissimilar dielectric material layers, a single opening formed over more than one S/D contacts with other components such as metal gate stacks (e.g., HKMG structures 210) disposed therebetween would not be able to form individual via contact features over the S/D contacts to fulfill the design requirement.

Figure 14B:
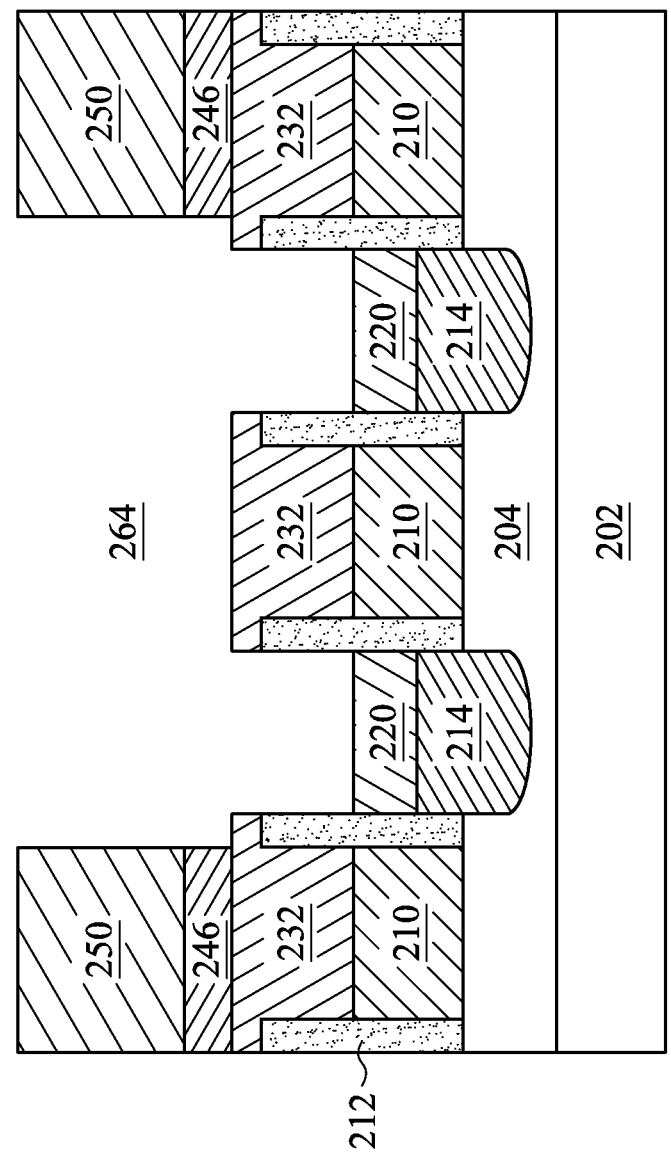

Referring to FIG. 14B, the method 100 at operation 152 selectively removes the ILD layer 250 and portions of the dielectric layer 242 by an etching process using the patterned masking element 260 as an etching mask. Notably, the etching process at operation 142 selectively removes the ILD layer 250 and the dielectric layer 242 (and the ESL 246) with respect to the dielectric layer 232. In other words, the etching process substantially removes the ILD layer 250 and the dielectric layer 242 but does not remove, or does not substantially remove, the dielectric layer 232. Depending upon the specific materials employed for the ILD layer 250 and the dielectric layer 242 (and the ESL 246), the etching process may be a single-step or a multi-step etching process. In some embodiments, the etching process is a dry etching process that employs one or more etchants, such as a fluorine-containing gas (e.g., $CF_4$, $SF_6$, $CH_2F_2$, $CHF_3$, and/or $C_2F_6$), a hydrogen-containing gas (e.g., $H_2$), an oxygen-containing gas (e.g., $O_2$), or combinations thereof. In one example, the etching process employs a mixture of $CF_4$, $CHF_3$, $CH_3F$, $H_2$, and/or $O_2$ to remove the ILD layer 250, the dielectric layer 242, and/or the ESL 246 exposed by the masking element 260. After performing the etching process, the patterned masking element 260 is removed by any suitable method, such as plasma ashing or resist stripping.

Figure 14C:
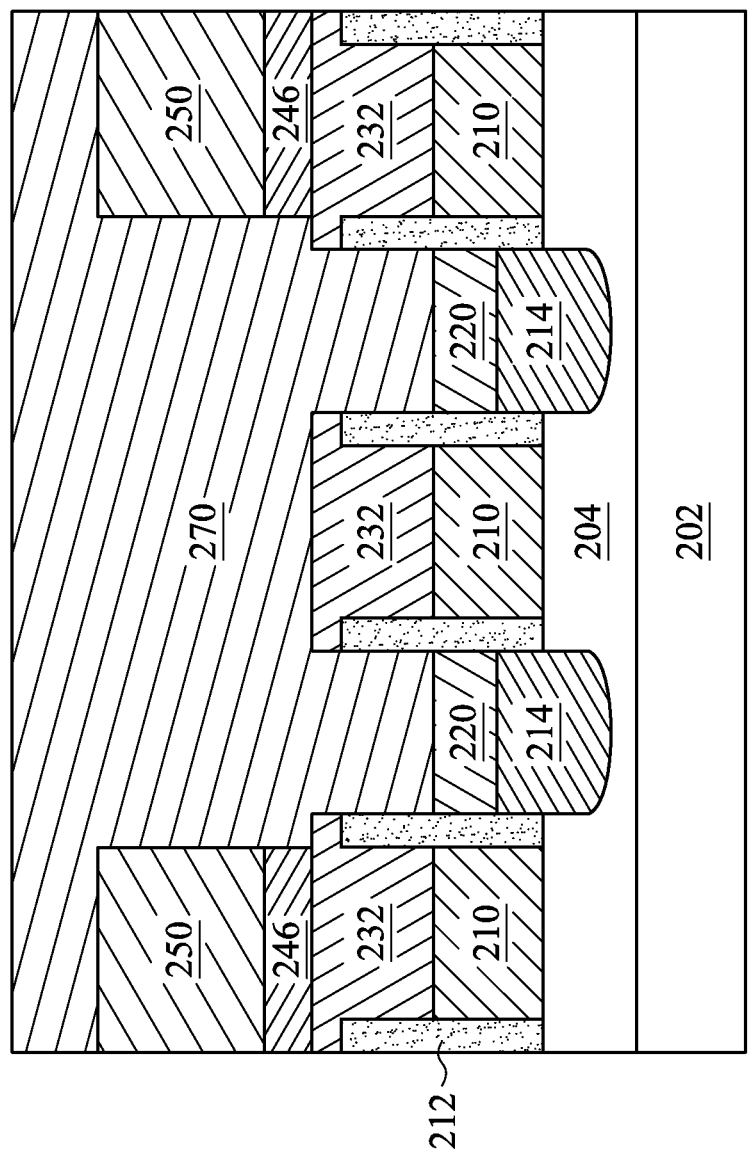

Referring to FIG. 14C, the method 100 at operation 154 deposits a conductive material 270 in the trench 264. The conductive material 270 may include any suitable material, such as W, Co, Ru, Cu, Ta, Ti, Al, Mo, other suitable conductive materials, or combinations thereof, and may be formed by any suitable method, such as CVD, ALD, PVD, plating, other suitable processes, or combinations thereof.

Figure 14D:
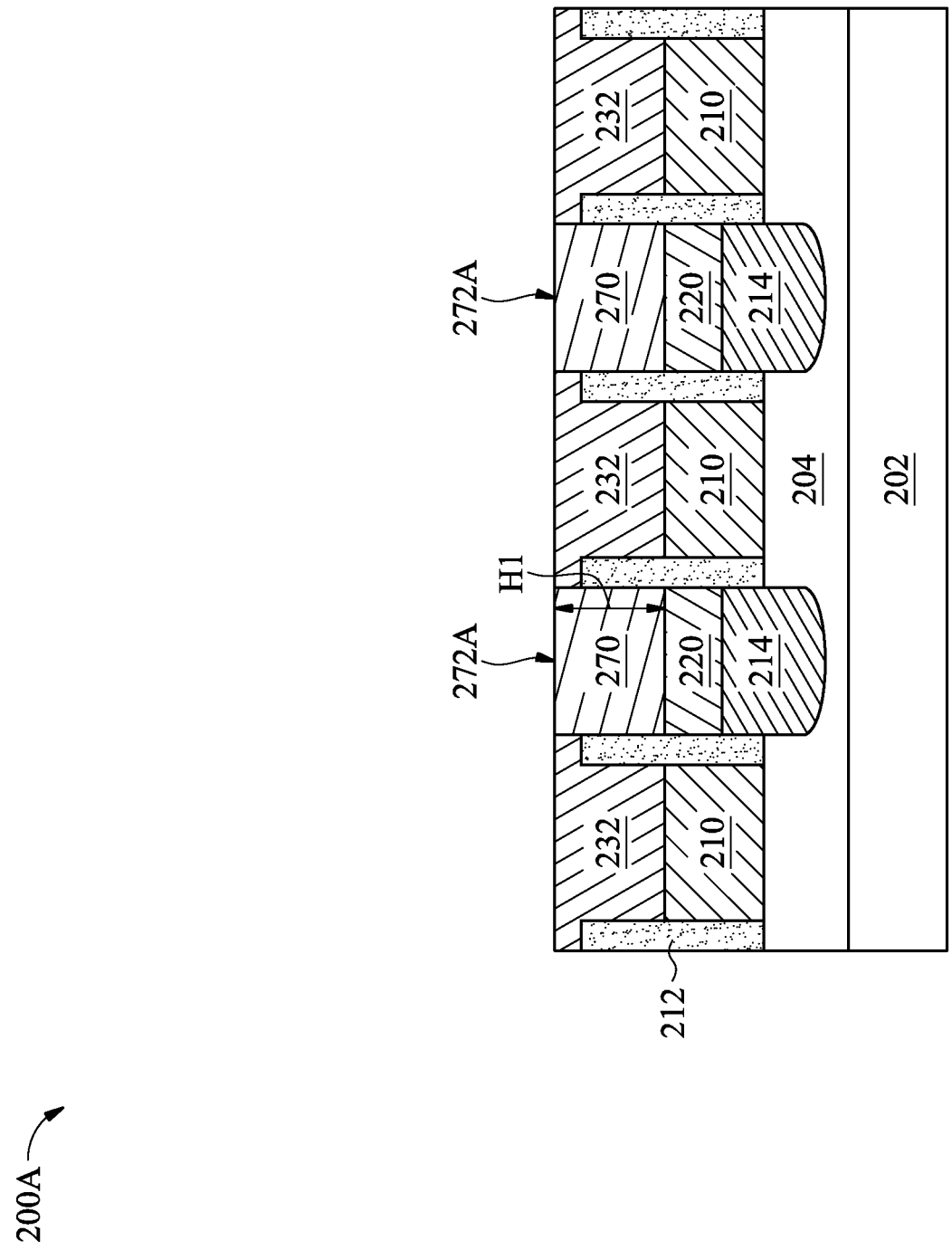
Figure 14E:
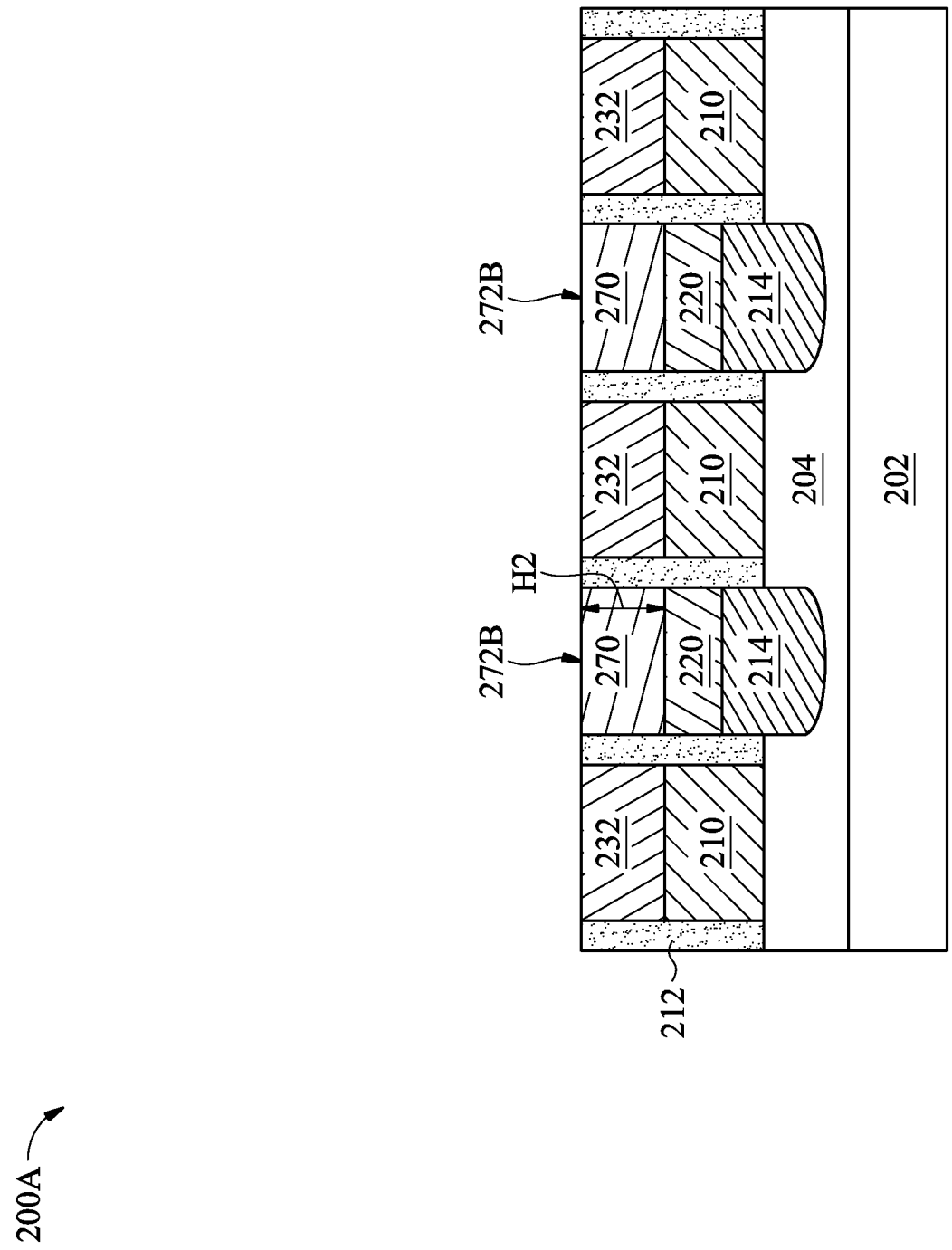

Now referring to FIGS. 1B, 14D, and 14E the method 100 at operation 170A or operation 170B performs one or more planarization processes to form via contact features (e.g., via contact features 272A and 272B) over the S/D contacts 220. Notably, operations 170A and 170B may be implemented as alternative embodiments, i.e., either operation may be chosen to form the via contact features based on specific design requirements.

Referring to FIG. 14D, the method 100 at operation 170A performs one or more planarization processes, such as CMP processes, to remove any remaining portions of the ESL 246 disposed over the dielectric layer 232 without substantially removing any dielectric layer 232. In some embodiments, the one or more CMP processes also remove portions of the conductive material 270 and the ILD layer 250 disposed over the dielectric layer 242. In other words, after implementing operation 170A, the dielectric layer 232 retains (or substantially retains) its "T" shape, a top portion of which is formed over the gate spacers 212. As such, top surfaces of the resulting via contact features 272A are above top surfaces of the gate spacers 212.

Referring to FIG. 14E, the method at operation 170B similarly performs one or more planarization processes, such as CMP processes, to remove portions of the dielectric layer 232 disposed over the gate spacers 212 (i.e., the top portion of the "T" shape), thereby exposing the gate spacers 212. In some embodiments, the one or more CMP processes also remove portions of the conductive material 270 and the ILD layer 250 disposed over the dielectric layer 232. As such, top surfaces of the resulting via contact features 272B are substantially planar with top surfaces of the gate spacers 212. Notably, because the extent of the planarization process differs between operations 170A and 170B, the heights (or thicknesses) of the resulting via contact features also differ. For example, a height H1 of the via contact feature 272A is greater than a height H2 of the via contact feature 272B.

Figure 15A:
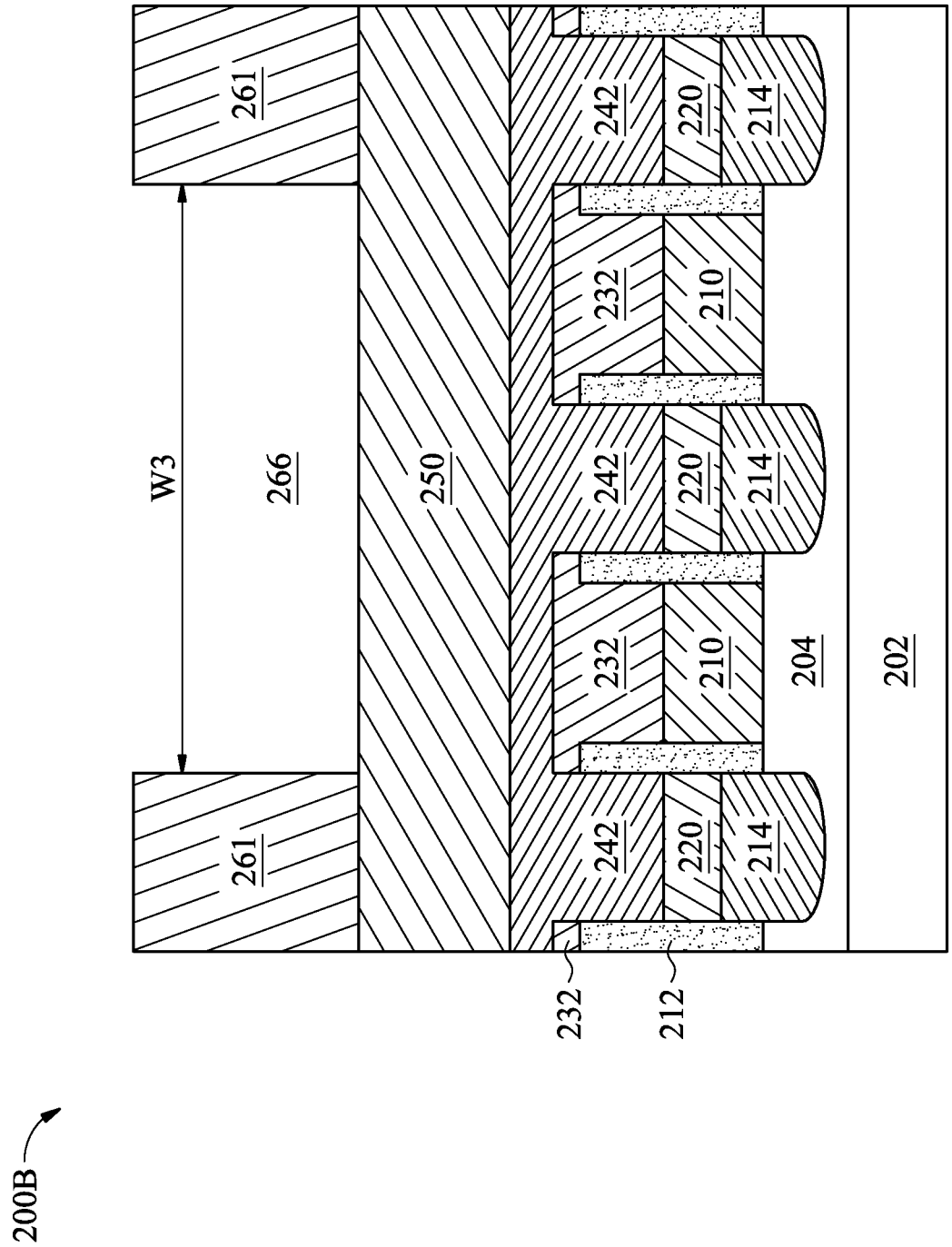

Now referring back to FIG. 1A, the method 100 implements analogous, though not identical, operations to form via contact features over the HKMG structures 210 in the region 200B. Referring to FIG. 15A, the method 100 at operation 160 forms a patterned masking element 261 over the region 200B of the device 200, such that a portion of the region 200B is exposed by a trench 266 formed in the patterned masking element 261. In some embodiments, the trench 266 is configured to fully expose at least two HKMG structures 210 (and any material layers formed thereover). In the depicted embodiment, for example, the trench 266 exposes two HKMG structures 210 and an S/D contact 220 disposed therebetween. In some embodiments, a width W3 of the trench 266 is not limiting, so long as it is wide enough to fully expose at least two HKMG structures 210. In some embodiments, because the present disclosure provides via contact features to interconnect HKMG structures 210 with subsequently formed circuit features and because portions of the dielectric layer 232 are formed over the gate spacers 212, the width W3 needs to be wide enough to expose the gate spacers 212 that end-cap the at least two HKMG structures 210 intended to be processed. The patterned masking element 261 may be similar to the patterned masking element 260 in composition and include a resist material (e.g., a photoresist material) patternable by one or more lithography processes.

Figure 15B:
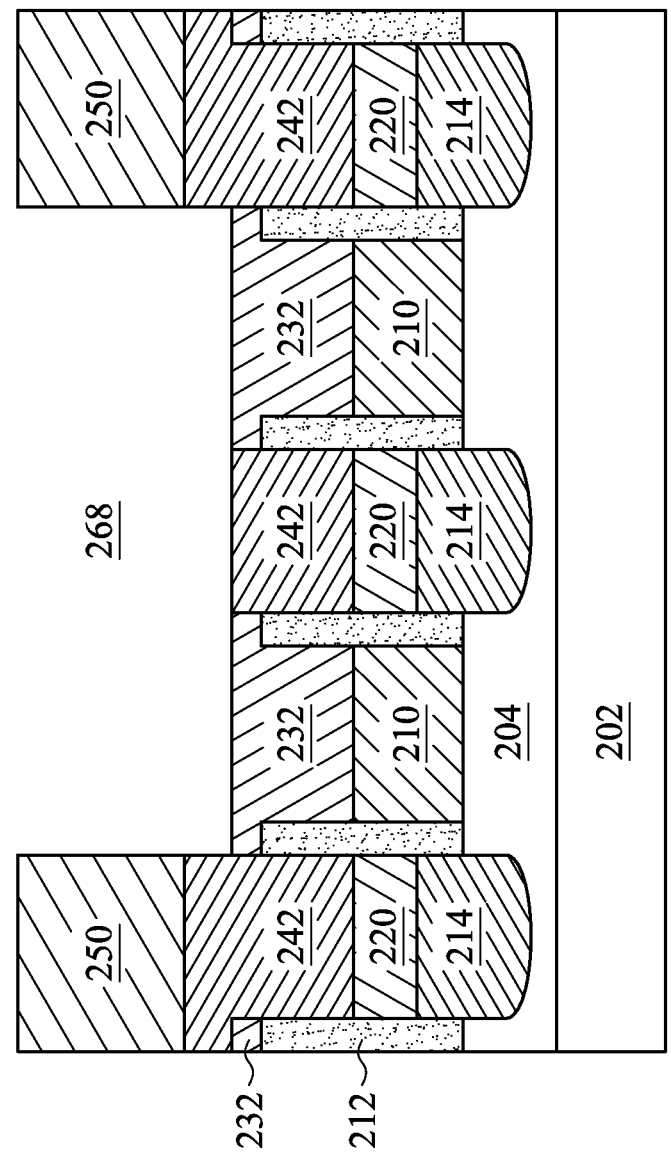

Referring to FIG. 15B, the method 100 at operation 162 removes the ILD layer 250 and portions of the dielectric layer 242 disposed over the dielectric layer 232 by an etching process that uses the patterned masking element 261 as an etching mask. Notably, the etching process at operation 152 selectively removes the ILD layer 250 and the dielectric layer 242 with respect to the dielectric layer 232. In other words, the etching process substantially removes the ILD layer 250 and the dielectric layer 242 but does not remove, or does not substantially remove, the dielectric layer 232.

Additionally, the etching process at operation 152 may be controlled such that only portions of the dielectric layer 242 disposed over the dielectric layer 232 are removed, while portions of the dielectric layer 242 disposed below a top surface of the dielectric layer 232 substantially remain. In the present embodiments, the etching process may be carried in a series of steps. For example, in a first step, the ILD layer 250 may be removed by a dry etching process employing an etchant that includes a fluorine-containing gas (e.g., $C_4F_6$, $CF_4$, $SF_6$, $CH_2F_2$, $CHF_3$, and/or $C_2F_6$), $H_2$, $O_2$, or combinations thereof. In the depicted embodiment, the dry etching process employs a mixture of $C_4F_6$, $H_2$, and/or $O_2$. Still referring to FIG. 15B, in a second step, portions of the dielectric layer 242 disposed over the dielectric layer 232 are selectively removed by another dry etching process employing an etchant that includes a fluorine-containing gas (e.g., $CF_4$, $CHF_3$, $CH_3F$, $C_4F_6$, $SF_6$, $CH_2F_2$, and/or $C_2F_6$), $H_2$, $O_2$, or combinations thereof. In the depicted embodiment, the second dry etching process employs a mixture of $CF_4$, $CHF_3$, $CH_3F$, $H_2$, and/or $O_2$. After performing the etching process, the patterned masking element 261 is removed by any suitable method, such as plasma ashing or resist stripping.

Figure 15C:
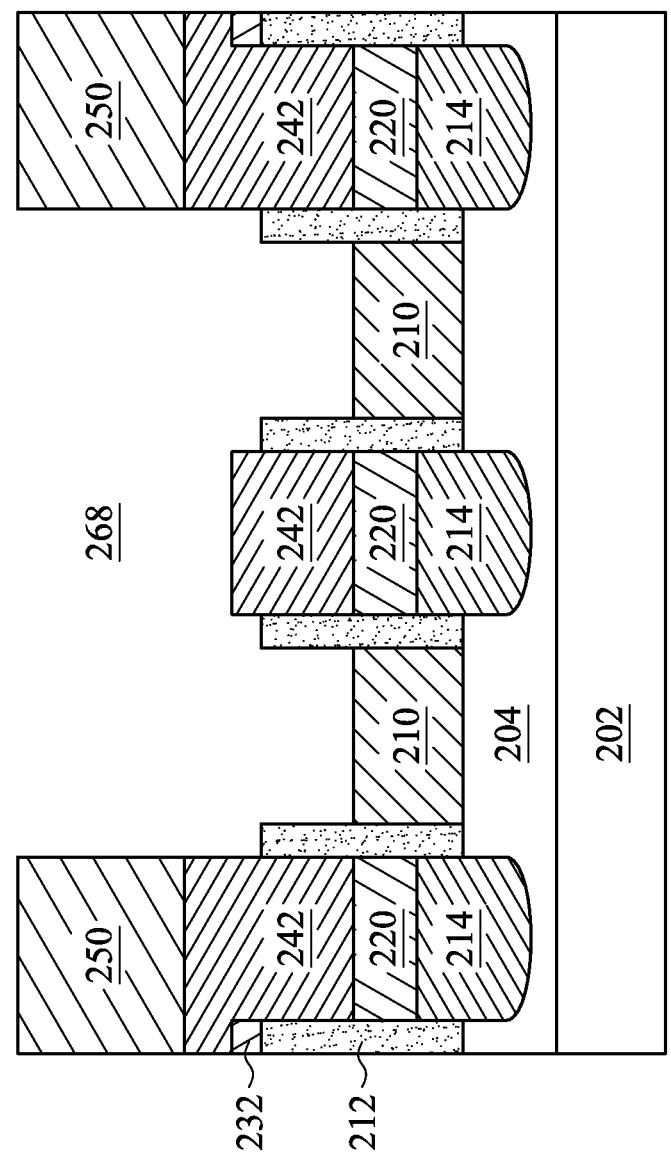

Referring to FIG. 15C, the method 100 at operation 164 selectively removes the dielectric layer 232 with respect to the remaining portions of the dielectric layer 242 by an etching process, thereby exposing top surfaces of the HKMG structures 210. Notably, the etching process substantially removes the dielectric layer 232 but does not remove, or does not substantially remove, the remaining portions of the dielectric layer 242. In some embodiments, the etching process is a dry etching process that employs one or more etchants, such as a fluorine-containing gas (e.g., $C_4F_6$, $CF_4$, $SF_6$, $CH_2F_2$, $CHF_3$, and/or $C_2F_6$), $H_2$, $O_2$, other suitable gases, or combinations thereof. In the depicted embodiment, the dry etching process employs a mixture of $C_4F_6$, $H_2$, and/or $O_2$ configured to remove the dielectric layer 232 exposed by the trench 268.

Figure 15D:
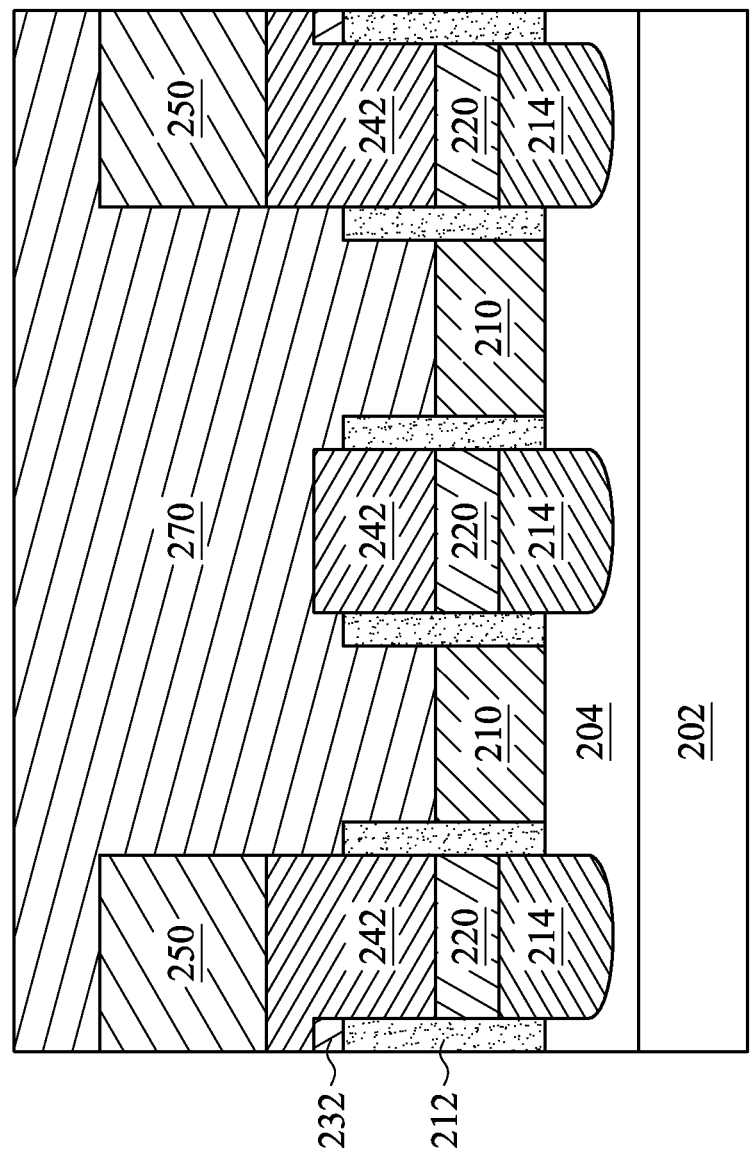

Referring to FIG. 15D, the method 100 at operation 166 deposits the conductive material 270 in the trench 268 in a manner similar to operation 154. Thereafter, referring to FIGS. 1B, 15E, and 15F, the method at operations 170A or 170B performs one or more planarization processes, such as CMP processes, to form via contact features 274A or 274B, respectively.

Figure 15E:
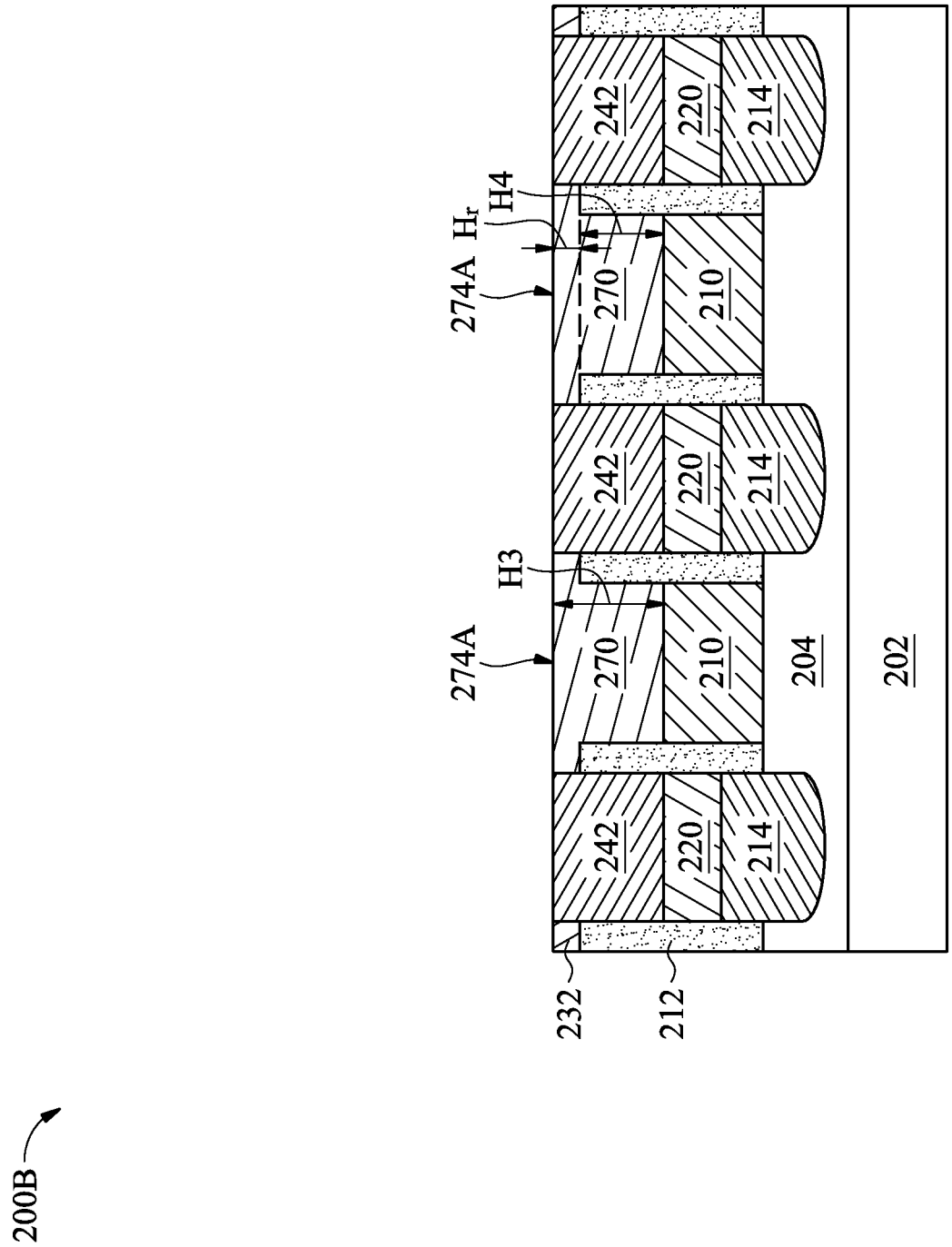
Figure 15F:
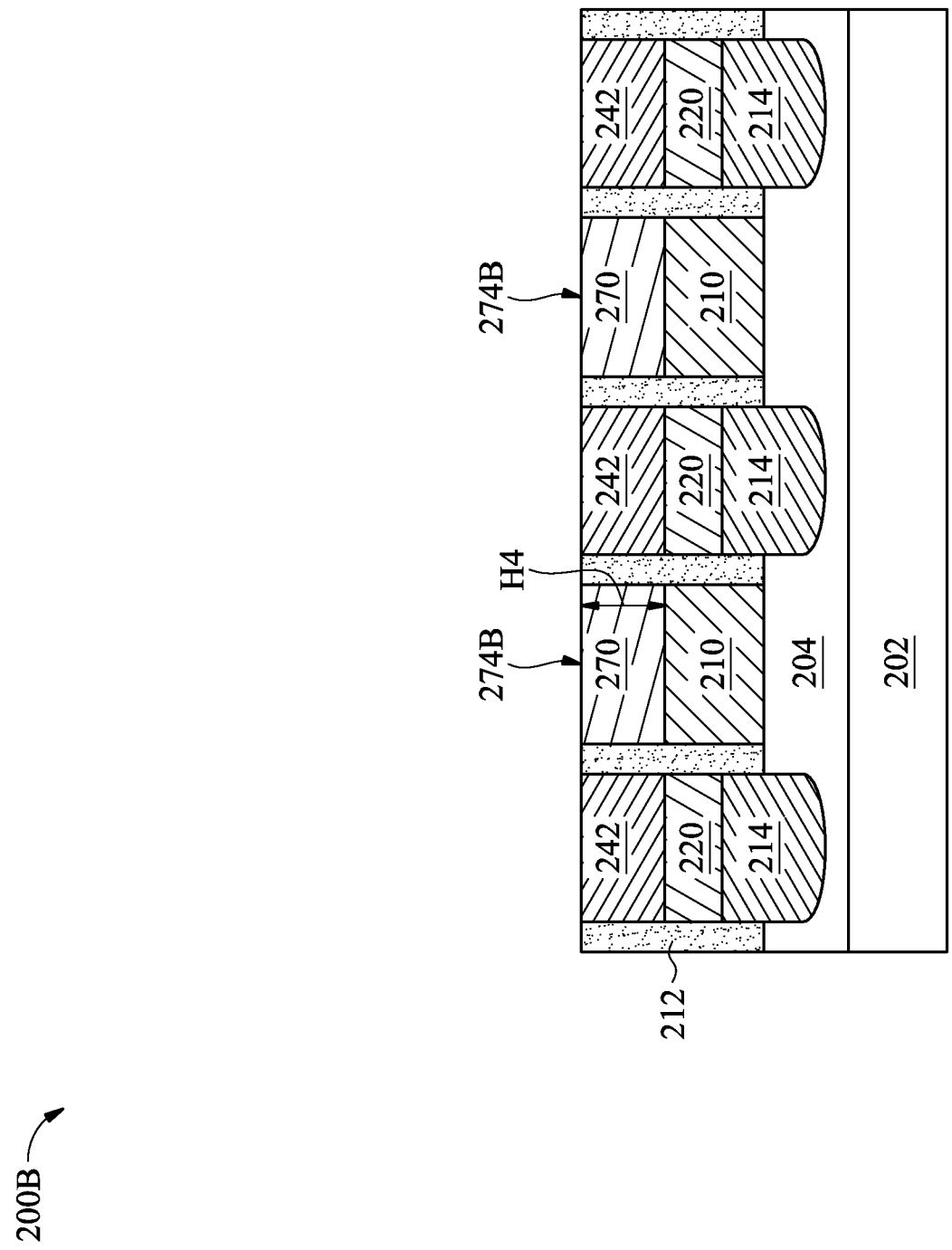

Specifically, referring to FIG. 15E, similar to that depicted in FIG. 14D, the method 100 at operation 160A removes portions of the dielectric layer 242 disposed over the dielectric layer 232. In some embodiments, the one or more CMP processes also remove portions of the conductive material 270 and the ILD layer 250 disposed over the dielectric layer 232. In other words, after implementing operation 170A, each via contact feature 274A is defined by a "T" shape, such that portions of each via contact feature 274A are disposed over the top surfaces of the gate spacers 212. Referring to FIG. 15F, similar to that depicted in FIG. 14E, the method 100 at operation 170B removes the material layers disposed over the top surfaces of the gate spacer 212, such that top surfaces of the remaining portions of the dielectric layer 242 and the via contact features 274B are substantially coplanar with the top surfaces of the gate spacers 212. Notably, as discussed above, because of the extent of the planarization process differs between operations 170A and 170B, the heights (or thicknesses) of the via contact features 274A and 274B also differ. In the depicted embodiment, a height H3 of the via contact feature 274A is greater than a height H4 of the via contact feature 274B, and a difference between H3 and H4 is attributed to a height $H_r$ of the top portion of the via contact features 274A, a portion hereafter referred to as the "roof" of the via contact feature 274A. In some embodiments, the height $H_r$ of the roof is not limited to a particular value, and may be similar to, greater than, or less than H4. In some embodiments, a ratio of $H_r$ to H4 is about 0.5 to about 3, depending upon specific design requirements and process variations. In some examples, $H_r$ and H4 may each be from about 5 to about 15 nm.

Figure 16A:
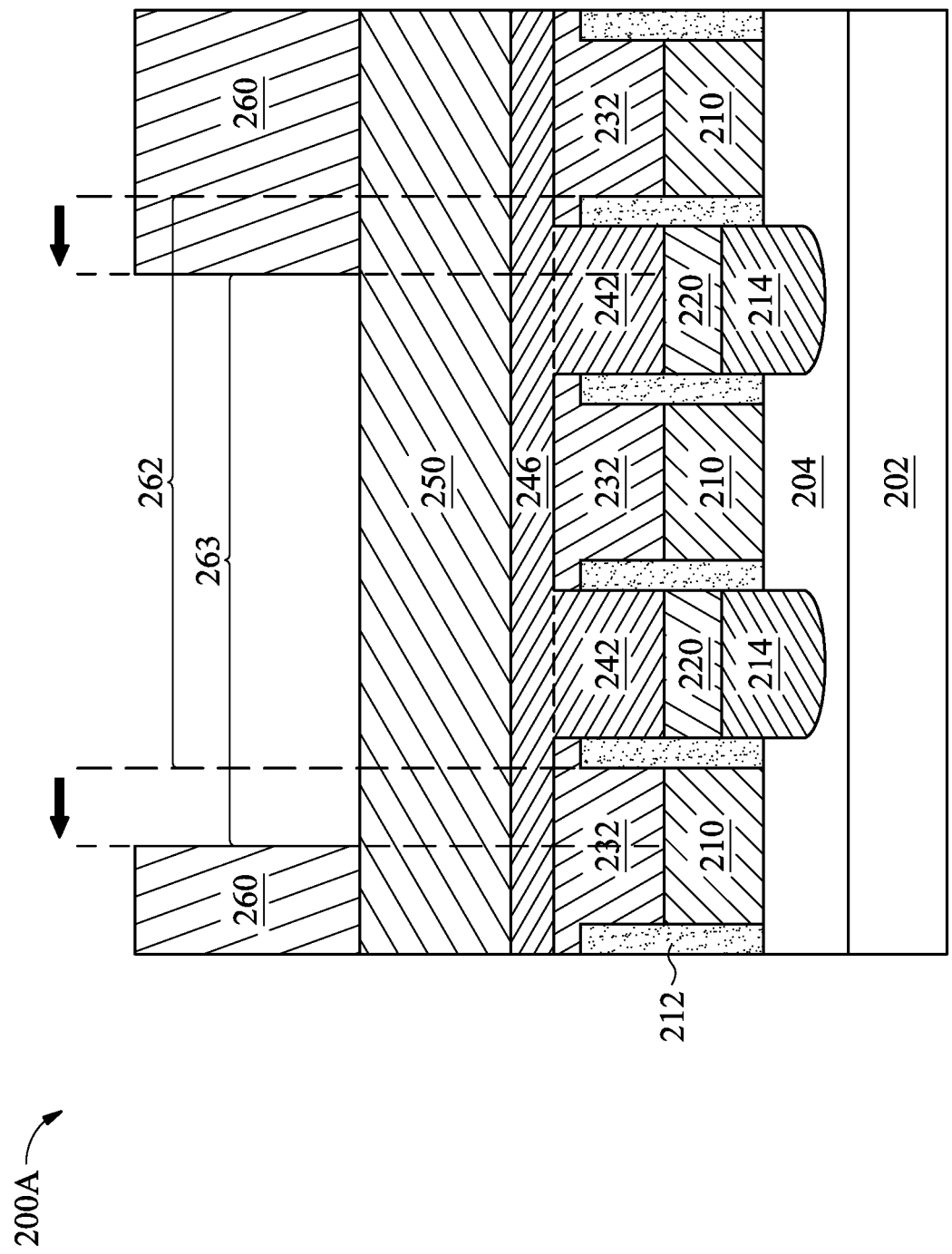
Figure 16B:
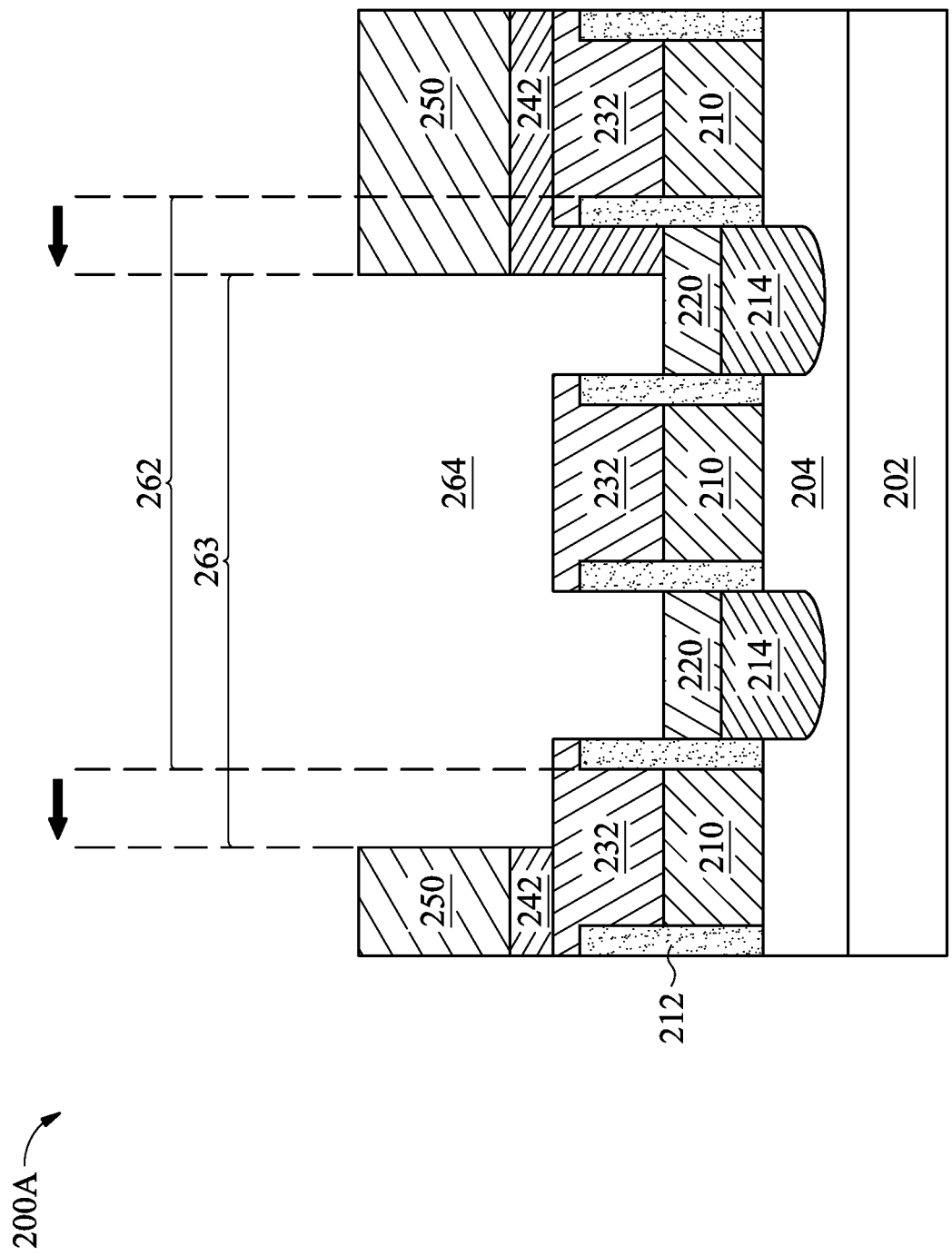
Figure 16C:
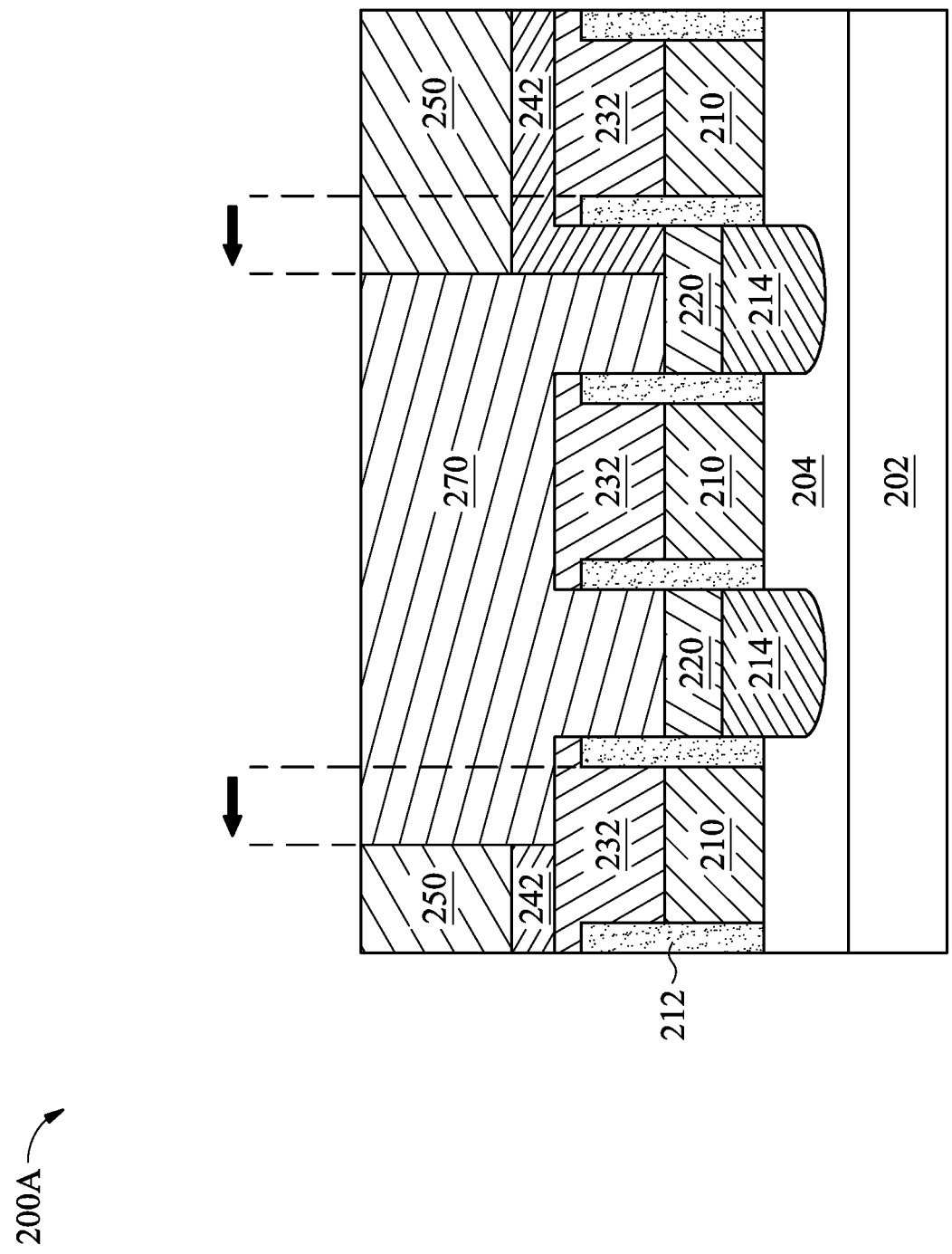
Figure 16D:
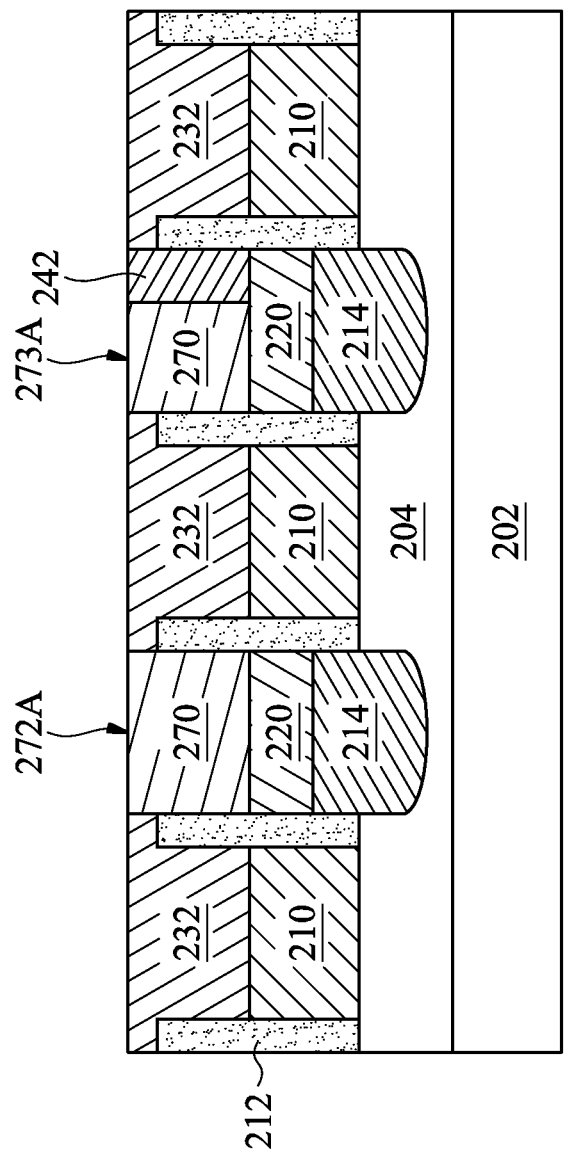
Figure 16E:
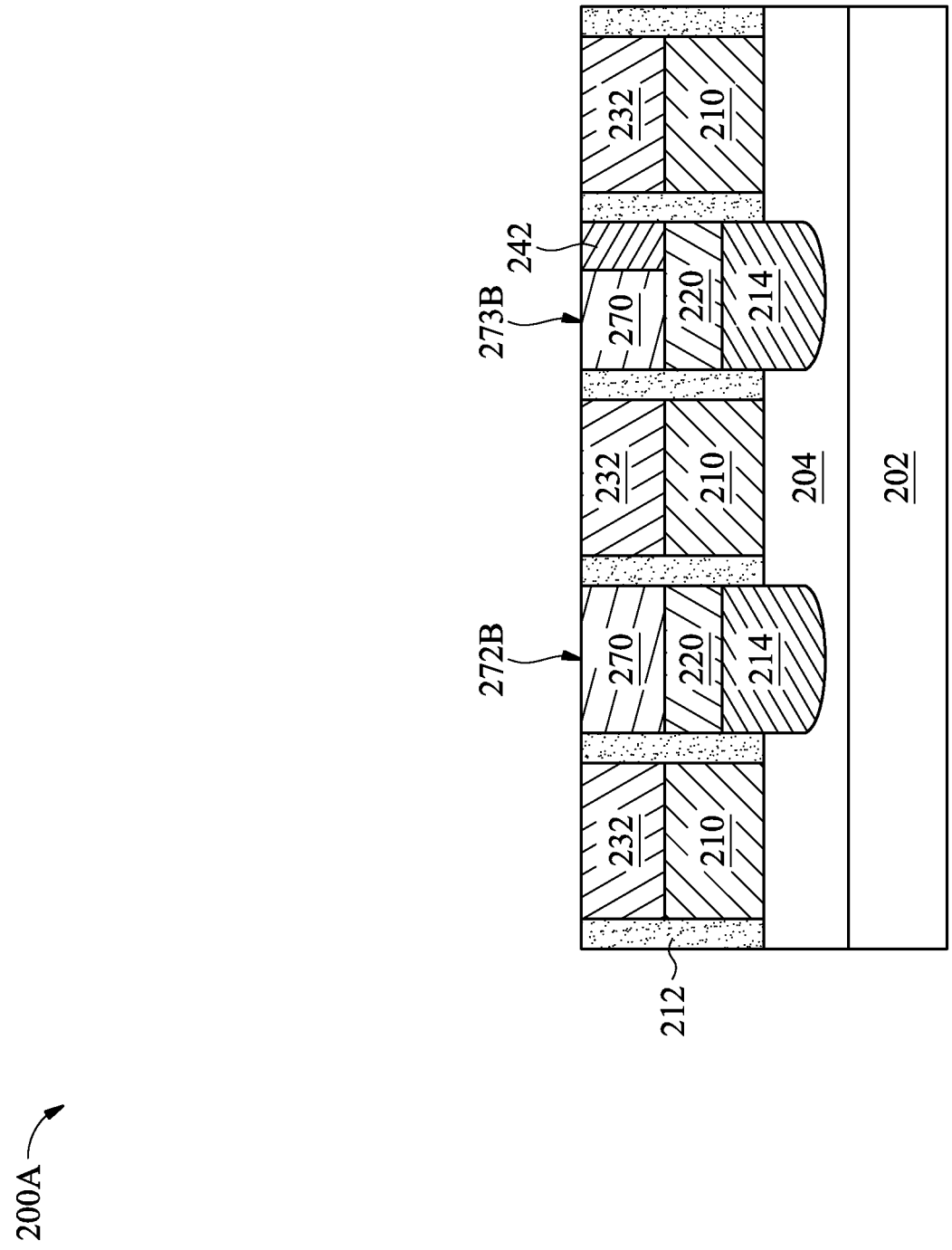

As discussed above, embodiments of the present disclosure may remedy overlay errors associated with the patterning process for forming via contact features. For forming via contact features (e.g., via contact features 272A and 272B) over S/D contacts (e.g., the S/D contacts 220), referring to FIG. 16A, if the masking element 260 is shifted from the intended position such that a trench 263 is offset from the trench 262, embodiments provided herein ensure that at least one via contact feature lands fully over one of the S/D contacts 220, such that the device performance may not be compromised as a result of the overlay error. In particular, referring to FIG. 16B, when portions of the ILD layer 250 and the dielectric layer 242 exposed by the trench 263 are selectively removed by an etching process similar to that discussed above with respect to operation 152, a portion of the dielectric layer 242 remains over one of the S/D contacts 220 due to the misalignment of the masking element 260 (comparing FIG. 16B with FIG. 14A). Consequently, referring to FIG. 16C, when the trench 263 is filled with the conductive material 270 in a process similar to that discussed with respect to operation 156, a top surface of one of the S/D contacts 220 may be defined by a portion of the conductive material 270 and the remaining portion of the dielectric layer 242. Referring to FIG. 16D, after performing one or more CMP processes similar to that discussed with respect to operation 170A, a resulting via contact feature 273A formed over one of the S/D contacts 220 includes the remaining portion of the dielectric layer 242, while the via contact feature 272A formed over the other one of the S/D contacts 220 includes only the conductive material 270 (comparing FIG. 16D with FIG. 14D). Similarly, referring to FIG. 16E, which depicts an embodiment similar to that discussed with respect to operation 170B, a resulting via contact feature 273B includes a mixture of the conductive material 270 and the remaining portion of the dielectric layer 242, while the via contact feature 272B includes only the conductive material 270 (comparing FIG. 16E with FIG. 14E).

Figure 17A:
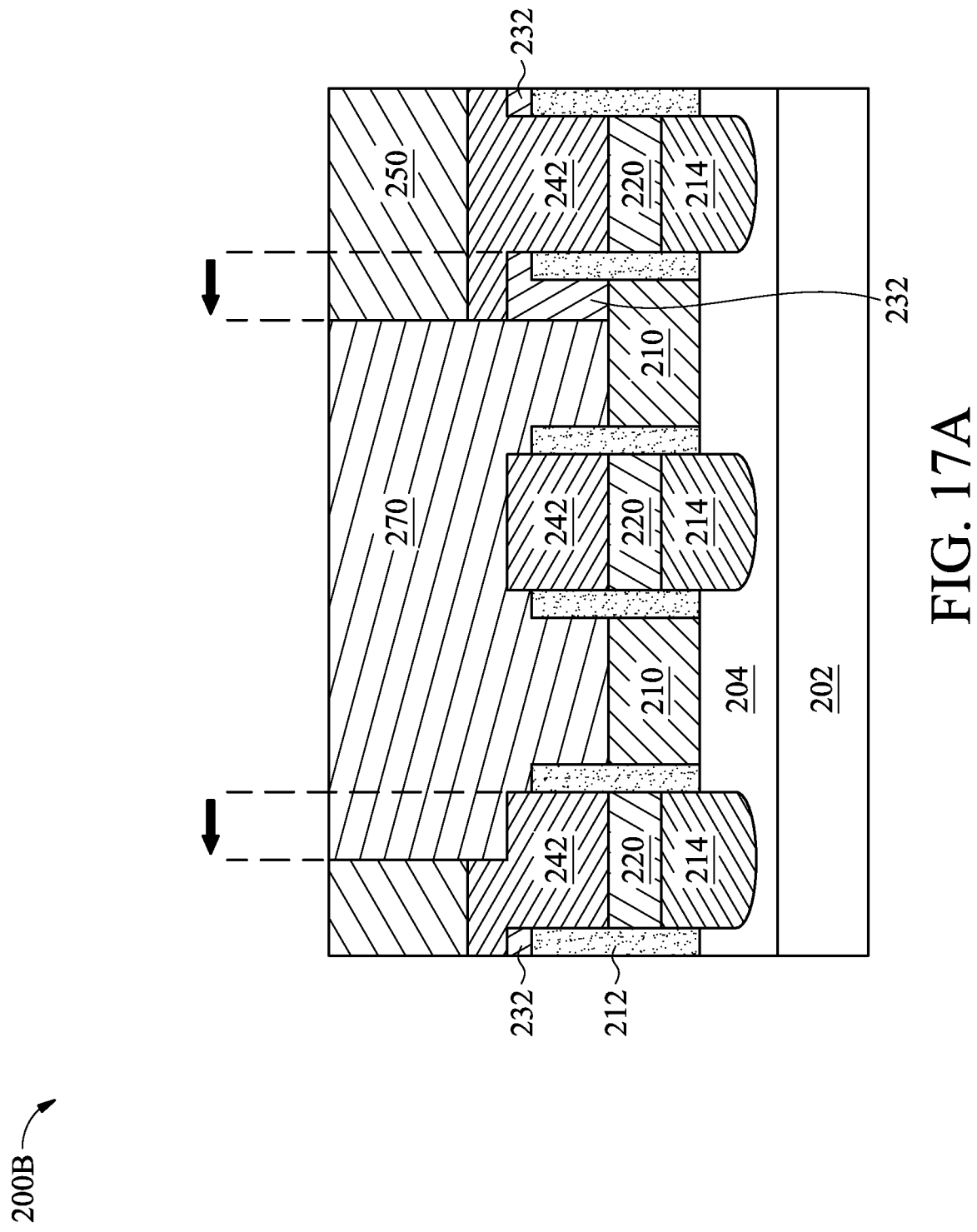
Figure 17B:
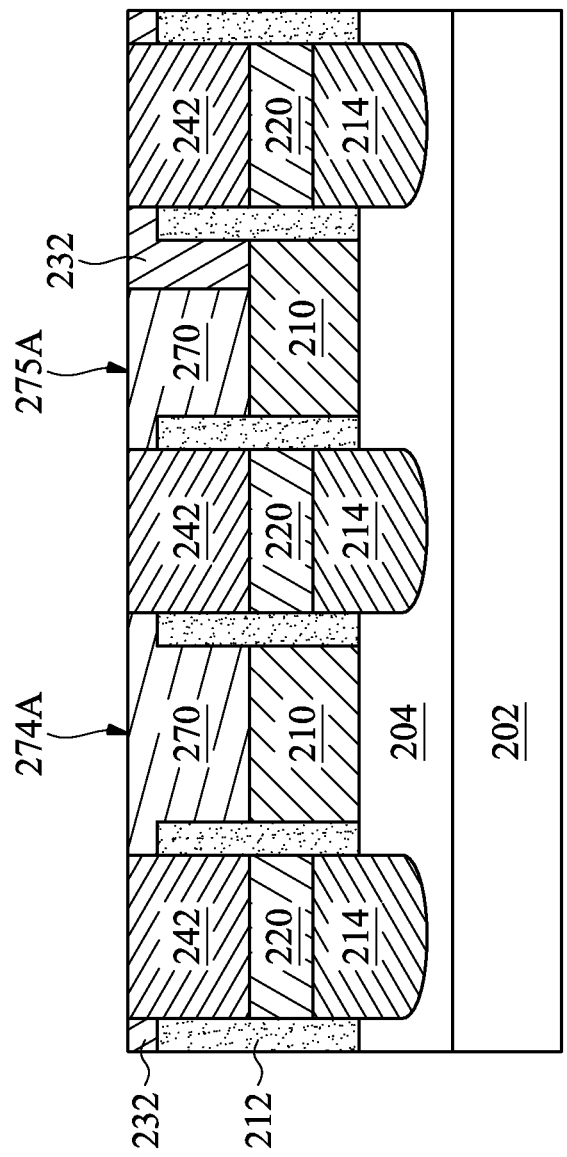
Figure 17C:
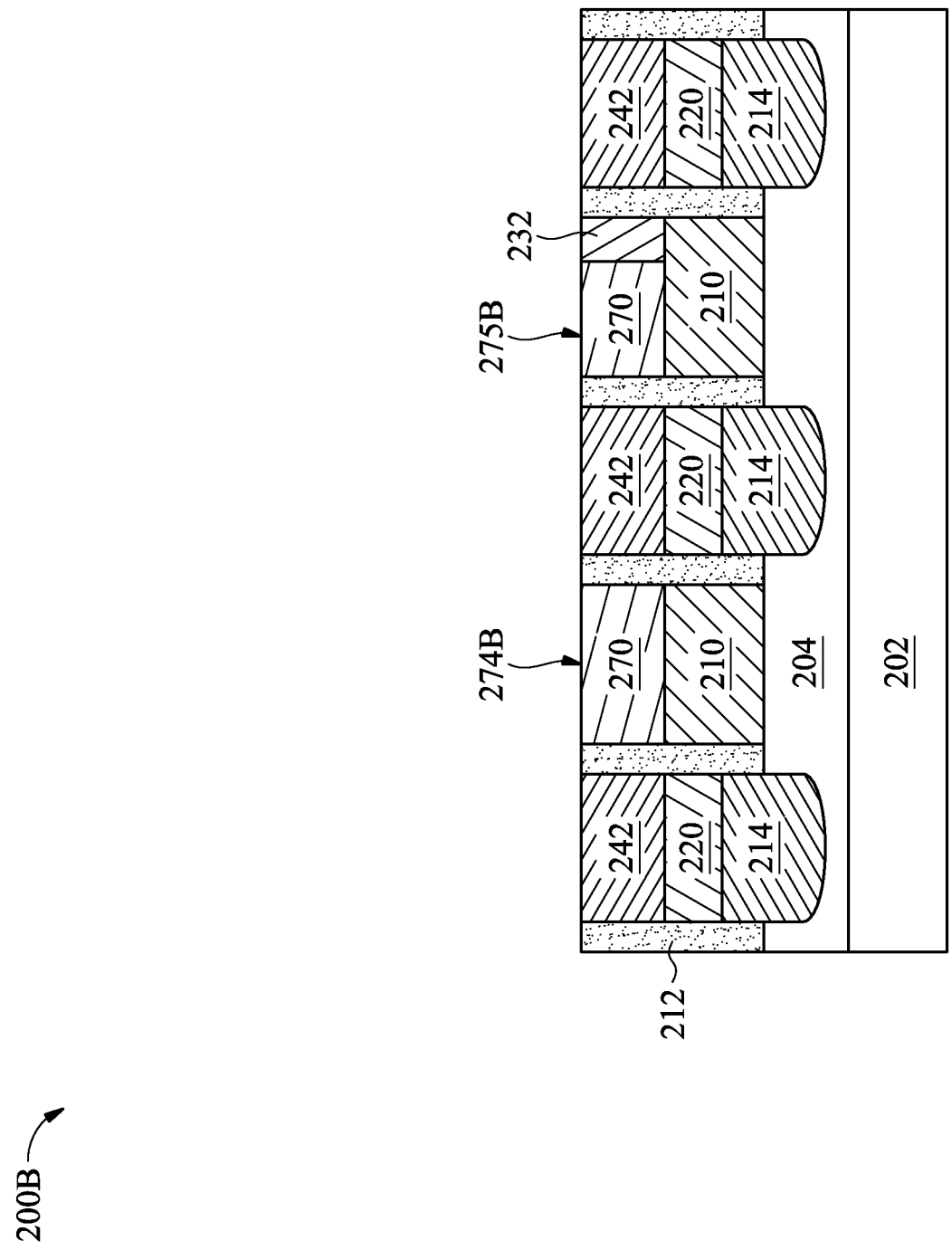

FIGS. 17A-17C depict embodiments for forming via contact features over the HKMG structures 210 when overlay errors occur during the patterning process. The fabrication steps are analogous to those discussed with respect to FIGS. 16A-16E and will be described briefly below. Referring to FIG. 17A, overlay errors cause a portion of the dielectric layer 232 to remain over one of the HKMG structures 210 after performing an etching process similar to that discussed with respect to operations 162 and 164, such that after depositing the conductive material 270 in a process similar to operation 166, a top surface of one of the HKMG structures 210 is defined by a portion of the conductive material 270 and the remaining portion of the dielectric layer 232. Referring to FIG. 17B, after performing one or more CMP processes similar to that discussed with respect to operation 170A, a resulting via contact feature 275A formed over one of the HKMG structures 210 includes the remaining portion of the dielectric layer 232, while the via contact feature 274A formed over the other one of the HKMG structure 210 includes only the conductive material 270

(comparing FIG. 17B with FIG. 15E). Similarly, referring to FIG. 17C, which depicts an embodiment similar to that discussed with respect to operation 170B, a resulting via contact feature 275B includes a mixture of the conductive material 270 and the remaining portion of the dielectric layer 232, while the via contact feature 274B includes only the conductive material 270 (e.g., comparing FIG. 17C with FIG. 15F).

Although not intended to be limiting, one or more embodiments of the present disclosure provide many benefits to a semiconductor device and the formation thereof. For example, embodiments of the present disclosure provide methods for forming via contact features that connect device-level features (e.g., S/D contacts, metal gate stacks, etc.) with additional interconnect features. In some embodiments, methods provided herein utilize a patterned masking element configured to expose at least two device-level features, followed by etching and deposition processes, to ensure that sufficient contact area may be subsequently established between the via contact features and the device-level features. In some embodiments, the via contact features are formed in a self-aligned manner utilizing dissimilar dielectric material layers to enhance etching selectivity during the etching process.

In one aspect, the present disclosure provides a method that begins with providing a semiconductor structure having metal gate structures (MGs), gate spacers disposed on sidewalls of the MGs, and source/drain (S/D) features disposed adjacent to the gate spacers. The method then proceeds to forming a first dielectric layer over the MGs and forming S/D contacts (MDs) over the S/D features. Afterwards, the method forms a second dielectric layer over the first dielectric layer, where portions of the second dielectric layer contact the MDs and the second dielectric layer is different from the first dielectric layer in composition, and subsequently removes the portions of the second dielectric layer that contact the MDs. Then the method proceeds to forming a conductive layer over the MDs and over the first dielectric layer and subsequently removing portions of the conductive layer to form conductive features over the MDs.

In another aspect, the present disclosure provides a method that begins with providing a semiconductor structure having MGs, gate spacers disposed on sidewalls of the MGs, and S/D features disposed adjacent to the gate spacers. The method then proceeds to recessing portions of the MGs and depositing a first dielectric layer over the recessed MGs, where the first dielectric layer is self-aligned with the gate spacers. Afterwards, the method forms MDs over the S/D features and proceeds to recessing portions of the MDs, followed by depositing a second dielectric layer over the recessed MDs and over the first dielectric layer. Then the method forms an ILD layer over the second dielectric layer, forms a trench in the ILD layer to expose the MGs, and removes portions of the first dielectric layer exposed by the trench. The method subsequently deposits a metal layer over the MGs and the second dielectric layer and planarizes a top surface of the metal layer to form conductive features over the MGs.

In yet another aspect, the present disclosure provides a semiconductor structure that includes an MG disposed over a semiconductor substrate, gate spacers disposed on sidewalls of the MG, an MD disposed over the semiconductor substrate and separated from the MG by the gate spacers, and a conductive feature disposed over the MG, where a top portion of the conductive feature is disposed over the gate spacers, and a bottom portion of the conductive feature includes sidewalls defined by the gate spacers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor structure having metal gate structures (MGs), gate spacers disposed on sidewalls of the MGs, and source/drain (S/D) features disposed adjacent to the gate spacers;
forming a first dielectric layer over the MGs;
forming S/D contacts (MDs) over the S/D features, wherein the MDs are disposed between portions of the first dielectric layer;
forming a second dielectric layer over the first dielectric layer, wherein portions of the second dielectric layer are formed between the gate spacers to contact the MDs, and wherein the second dielectric layer is different from the first dielectric layer in composition;
removing the portions of the second dielectric layer between the gate spacers to expose the MDs;
forming a conductive layer over the exposed MDs and over the first dielectric layer; and
removing portions of the conductive layer to form conductive features over the MDs.

2. The method of claim 1, wherein forming the first dielectric layer includes:
recessing portions of the MGs; and
forming the first dielectric layer over the recessed MGs, the gate spacers, and the S/D features.

3. The method of claim 2, wherein forming the first dielectric layer includes depositing a first dielectric material over the recessed MGs and the gate spacers and performing a chemical-mechanical polishing (CMP) process to remove portions of the first dielectric material formed over the S/D features.

4. The method of claim 2, wherein forming the first dielectric layer includes selectively depositing a first dielectric material over the recessed MGs and the gate spacers but not over the MDs.

5. The method of claim 1, wherein forming the second dielectric layer includes:
recessing portions of the MDs; and
depositing a second dielectric material over the MDs and the first dielectric layer.

6. The method of claim 1, wherein removing the portions of the second dielectric layer includes:
forming a third dielectric layer over the second dielectric layer, wherein the third dielectric layer is different from the first and the second dielectric layers in composition;
patterning the third dielectric layer to form a trench, thereby exposing portions of the first and the second dielectric layers; and
selectively etching the exposed portions of the second dielectric layer between the gate spacers with respect to the exposed portions of the first dielectric layer, wherein removing the portions of the conductive layer removes the third dielectric layer.

7. The method of claim 6, wherein selectively etching the second dielectric layer includes implementing an etchant including a fluorine-containing gas, hydrogen, oxygen, or combinations thereof.

8. The method of claim 1, wherein removing portions of the conductive layer includes planarizing the conductive layer along a top surface of the first dielectric layer.

9. The method of claim 1, wherein removing portions of the conductive layer includes planarizing the conductive layer along a top surface of the gate spacers.

10. A method, comprising:
providing a semiconductor structure having metal gate structures (MGs), gate spacers disposed on sidewalls of the MGs, and source/drain (S/D) features disposed adjacent to the gate spacers;
recessing portions of the MGs;
depositing a first dielectric layer over the recessed MGs, wherein the first dielectric layer is self-aligned with the gate spacers;
forming S/D contacts (MDs) over the S/D features;
recessing portions of the MDs;
depositing a second dielectric layer over the recessed MDs and over the first dielectric layer;
forming an interlayer dielectric (ILD) layer over the second dielectric layer;
forming a trench in the ILD layer over the MGs;
removing portions of the first dielectric layer exposed in the trench;
depositing a metal layer over the MGs and the second dielectric layer; and
planarizing a top surface of the metal layer to form conductive features over the MGs.

11. The method of claim 10, wherein removing the first dielectric layer includes:
removing portions of the second dielectric layer disposed over the first dielectric layer in a first etching process; and
selectively removing the first dielectric layer with respect to the gate spacers and remaining portions of the second dielectric layer in a second etching process.

12. The method of claim 11, wherein the first etching process is implemented with an etchant including $CF_4$, $CHF_3$, $CH_3F$, $H_2$, $O_2$, or combinations thereof.

13. The method of claim 11, wherein the second etching process is implemented with an etchant including $C_4F_6$, $H_2$, $O_2$, or combinations thereof.

14. The method of claim 10, wherein planarizing the top surface of the metal layer includes performing a chemical-mechanical polishing (CMP) process along a top surface of the first dielectric layer.

15. The method of claim 10, wherein planarizing the top surface of the metal layer includes performing a chemical-mechanical polishing (CMP) process along a top surface of the gate spacers.

16. A method, comprising:
forming a semiconductor structure having a gate stack (MG), a gate spacer disposed on a sidewall of the MG, and a source/drain (S/D) contact (MD) disposed over an S/D feature adjacent to the gate spacer;
recessing portions of the MG;
forming a first dielectric layer over the recessed MG;
recessing portions of the MD;
forming a second dielectric layer over the first dielectric layer, wherein portions of the second dielectric layer extend along a sidewall of the gate spacer to contact the recessed MD, and wherein the first and the second dielectric layers differ in composition;
forming a patterned third dielectric layer to expose portions of the first and the second dielectric layers in a trench;
selectively removing the exposed portions of the second dielectric layer with respect to the exposed portions of the first dielectric layer to expose the recessed MD in the trench;
depositing a conductive layer in the trench; and
planarizing the conductive layer to form a contact feature over the recessed MD, thereby removing the patterned third dielectric layer.

17. The method of claim 16, wherein a portion of the first dielectric layer is formed to contact a top surface of the gate spacer.

18. The method of claim 17, wherein planarizing the conductive layer removes the portion of the first dielectric layer to expose the top surface of the gate spacer.

19. The method of claim 17, wherein planarizing the conductive layer leaves the portion of the first dielectric layer over the top surface of the gate spacer.

20. The method of claim 16, wherein selectively removing the second dielectric layer leaves a remaining portion of the second dielectric layer disposed along the sidewall of the gate spacer, such that the remaining portion of the second dielectric layer separates the contact feature from the gate spacer.

* * * * *